United States Patent
Li et al.

(10) Patent No.: US 12,057,394 B2
(45) Date of Patent: Aug. 6, 2024

(54) THREE-DIMENSIONAL (3D) INTERCONNECT STRUCTURES EMPLOYING VIA LAYER CONDUCTIVE STRUCTURES IN VIA LAYERS AND RELATED FABRICATION METHODS

(71) Applicant: QUALCOMM Incorporated, San Diego, CA (US)

(72) Inventors: Xia Li, San Diego, CA (US); Junjing Bao, San Diego, CA (US); Bin Yang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 354 days.

(21) Appl. No.: 17/410,690

(22) Filed: Aug. 24, 2021

(65) Prior Publication Data

US 2023/0061693 A1 Mar. 2, 2023

(51) Int. Cl.
*H01L 23/528* (2006.01)
*H01L 21/768* (2006.01)
(Continued)

(52) U.S. Cl.
CPC .... *H01L 23/5283* (2013.01); *H01L 21/76816* (2013.01); *H01L 21/7682* (2013.01);
(Continued)

(58) Field of Classification Search
CPC ............. H01L 23/5283; H01L 23/5226; H01L 23/53295; H01L 23/5222; H01L 23/5286;
(Continued)

(56) References Cited

U.S. PATENT DOCUMENTS

2002/0162079 A1 10/2002 Igarashi et al.
2013/0341793 A1 12/2013 Suzumura et al.
(Continued)

OTHER PUBLICATIONS

International Search Report and Written Opinion for International Patent Application No. PCT/US2022/073933, dated Nov. 8, 2022, 15 pages.
(Continued)

*Primary Examiner* — Shahed Ahmed
*Assistant Examiner* — Vicki B. Booker
(74) *Attorney, Agent, or Firm* — W&T/Qualcomm Incorporated

(57) ABSTRACT

Three-dimensional (3D) interconnect structures employing via layer conductive structures in via layers are disclosed. The via layer conductive structures in a signal path in an interconnect structure are disposed in respective via layers adjacent to metal lines in metal layers. The via layer conductive structures increase the conductive cross-sections of signal paths between devices in an integrated circuit (IC) or to/from an external contact. The via layer conductive structures provide one or both of supplementing the height dimensions of metal lines and electrically coupling metal lines in the same or different metal layers to increase the conductive cross-section of a signal path. The increased conductive cross-section reduces current-resistance (IR) drop of signals and increases signal speed. As metal track pitches are reduced in size, signal path resistance increases. The via layer conductive structures are provided to reduce or avoid an even greater increase in resistance in the signal paths.

18 Claims, 15 Drawing Sheets

(51) Int. Cl.
  *H01L 23/522* (2006.01)
  *H01L 23/532* (2006.01)
(52) U.S. Cl.
  CPC .... *H01L 23/5226* (2013.01); *H01L 21/76834* (2013.01); *H01L 23/53295* (2013.01)
(58) Field of Classification Search
  CPC .......... H01L 21/76816; H01L 21/7682; H01L 21/76834
  See application file for complete search history.

(56) References Cited

U.S. PATENT DOCUMENTS

| | | | |
|---|---|---|---|
| 2016/0079175 A1* | 3/2016 | Zhu | H01L 21/76831 438/618 |
| 2016/0104674 A1 | 4/2016 | Hsieh et al. | |
| 2017/0117272 A1 | 4/2017 | Sio et al. | |
| 2017/0358506 A1 | 12/2017 | Ohashi et al. | |
| 2020/0083182 A1* | 3/2020 | Sio | H01L 23/564 |
| 2022/0199522 A1 | 6/2022 | Lee et al. | |

OTHER PUBLICATIONS

Lin K.L., et al., "Staggered Metallization with Air Gaps for Independently Tuned Interconnect Resistance and Capacitance", 2020 IEEE International Electron Devices Meeting (IEDM), 2020, pp. 32.5.1-32.5.4.

Na, M.H., "Innovative technology elements to enable CMOS scaling in 3nm and beyond: device architectures, parasitics and materials," Tutorial 5, 66th International Electron Devices Meeting (IEDM), Dec. 2020, 77 pages.

Tokei, Z., "Nano-Interconnect," IMEC, Jan. 15, 2020, 16 pages.

* cited by examiner

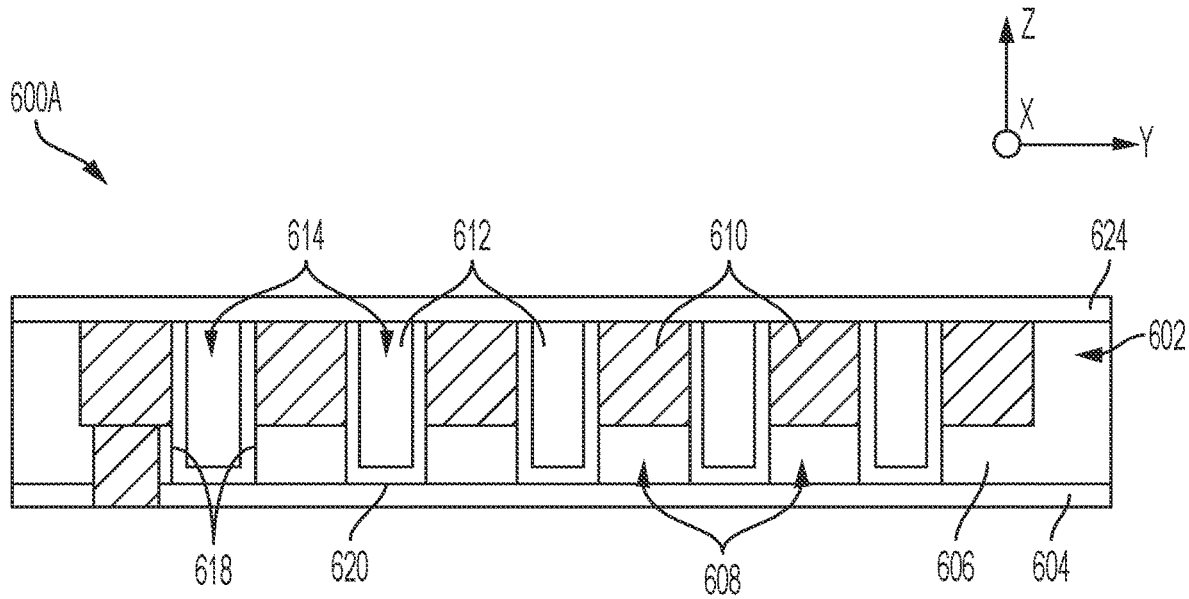

FIG. 6A

```
FORM FIRST METAL LAYER (602)
      -DEPOSIT AN INTER-METAL DIELECTRIC (IMD) (606) ON A SILICON CARBON NITRIDE
      (SiCN) LAYER (604)
      -PATTERN AND ETCH METAL TRACKS (608) IN THE IMD (606) EXTENDING IN THE FIRST
 DIRECTION
      -FORM METAL LINES (610) OF AN INTERCONNECT METAL (IM) IN THE METAL TRACKS (608)
FORM AIR GAPS (612) INCLUDING:
      -ETCH VOIDS (614) IN THE IMD (606) BETWEEN THE METAL LINES (610)
      -FORM SILICON NITRIDE LAYER (616) ON SIDES (618) AND BOTTOM (620) OF VOIDS (614)
FORM SiCN LAYER (624)
```

FIG. 6B

THREE-DIMENSIONAL (3D) INTERCONNECT STRUCTURES EMPLOYING VIA LAYER CONDUCTIVE STRUCTURES IN VIA LAYERS AND RELATED FABRICATION METHODS

BACKGROUND

I. Field of the Disclosure

The technology of the disclosure relates generally to back-end-of-line (BEOL) interconnect structures employed in integrated circuits (ICs) to electrically couple components in ICs to each other or to external circuits.

II. Background

Electronic devices, such as hand-held devices and other mobile devices have become commonplace in society, in part because of the high performance and broad range of functionality made possible by integrated circuits (ICs). ICs contain large numbers of transistors and other electrical components of electrical circuits that provide the function and performance of an electronic device. The transistors and other components are interconnected by metal traces in metal layers and vertical interconnect assesses (vias) in via layers on a semiconductor substrate.

Market competition for faster and smaller devices provides a constant pressure to reduce the sizes of ICs. To reduce the size of an IC without reducing the number of circuits that provide the functionality, the transistors and the interconnects must be reduced in size to fit in a smaller area. To achieve a smaller area for the interconnects, the widths of metal traces in the interconnects can be reduced. The metal layers in which the metal traces are formed may have a fixed thickness and the metal traces are disposed in tracks with a predetermined width and spacing according to a track pitch. Therefore, reducing the size of an IC includes reducing the width of track in a metal layer in which a metal trace is formed, which reduces the cross-sectional area of the metal trace.

The resistance of a metal trace is inversely related to its cross-sectional area. As the size of an IC decreases and the cross-sectional area of a metal trace decreases, the electrical resistance of metal traces in the IC increases. A track pitch includes the width of a track and a spacing between tracks. Thus, the track pitch may be reduced if the width of the track is reduced. The track may be further reduced by placing the tracks closer together, but this increases capacitance between the metal traces. Increased path resistance can increase power loss due to heat generation. In conjunction with increased capacitance, increased resistance can slow down propagation of signals between components (i.e., through the traces).

SUMMARY OF THE DISCLOSURE

Aspects disclosed in the detailed description include three-dimensional (3D) interconnect structures employing via layer conductive structures in via layers. Related methods of fabricating a 3D interconnect structure including via layer conductive structures are also disclosed.

The via layer conductive structures in a signal path are disposed in respective via layers adjacent to a metal layer(s) that includes metal lines of the interconnect structure. The via layer conductive structures increase the conductive cross-sections of signal paths for signals through the interconnect structure between devices in an IC or from a device to an external contact (i.e., bump or pin) of the integrated circuit (IC). The via layer conductive structures provide one or both of supplementing the height dimensions of metal lines and electrically coupling metal lines in different metal layers to increase the conductive cross-section of a signal path. The increased conductive cross-section of a signal path provided by the via layer conductive structures reduces resistance, which reduces current-resistance (IR) drop of signals (e.g., power signals) carried over the signal paths and also increases signal speed. As IC circuits are reduced in size, the metal track pitch for the metal lines in metal layers may also be reduced in size, which has the effect of increasing signal path resistance in the interconnect structure. In this regard, in exemplary aspects, to reduce or avoid an even greater increase in resistance in the signal paths as the metal track pitches in the interconnect structure are reduced, the via layer conductive structures are provided. One dimension of the via layer conductive structures extends farther than a metal track pitch in an adjacent metal layer in which metal tracks run orthogonal to the direction of current flow. The via layer conductive structures have the effect of reducing resistance in signal paths in the interconnect structure. In one exemplary aspect, a metal line in a first metal layer extends in a first direction and a via layer conductive structure is disposed on the metal line to effectively increase a height dimension of the metal line. The via layer conductive structure extends in the first direction a distance greater than the metal track pitch of a second metal layer adjacent to the first metal layer. In another exemplary aspect, a via layer conductive structure couples together a first metal line in a first track in a first metal layer and a second metal line in a next adjacent metal track in the first metal layer by extending from the first metal line to the second metal line in a via layer adjacent to the first metal layer. In another exemplary aspect, air gaps between metal lines in different signal paths reduce capacitance to improve signal path speed.

In this regard in one aspect, an exemplary interconnect structure is disclosed. The interconnect structure comprises a first metal layer comprising a first metal line in a first track among a plurality of first tracks extending in a first direction, the plurality of first tracks having a first track pitch. The interconnect structure includes a second metal layer adjacent to the first metal layer, the second metal layer comprising a plurality of second tracks extending in a second direction orthogonal to the first direction, the plurality of second tracks having a second track pitch. The interconnect structure further includes a via layer conductive structure in a via layer adjacent to the first metal layer, the via layer conductive structure coupled to the first metal line in the first metal layer and having a first length in the first direction greater than the second track pitch.

In another aspect, an exemplary interconnect structure is disclosed. The interconnect structure comprises a first metal layer comprising a first metal line in a first track among a plurality of tracks extending in a first direction, the plurality of tracks having a track pitch, and a second metal line in a second track among the plurality of tracks, the second track comprising an adjacent track next to the first track in a second direction orthogonal to the first direction. The interconnect structure includes a via layer conductive structure in a via layer adjacent to the first metal layer, the via layer conductive structure coupled to the first metal line and the second metal line and having a first length in the second direction greater than the track pitch.

In another aspect, an exemplary method of fabricating an interconnect structure is disclosed. The method comprises forming a first metal layer comprising a first metal line in a track among a plurality of first tracks extending in a first direction, the plurality of first tracks having a first track pitch. The method comprises forming a second metal layer adjacent to the first metal layer, the second metal layer comprising a plurality of second tracks extending in a second direction orthogonal to the first direction, the plurality of second tracks having a second track pitch. The method further comprises forming a via layer conductive structure in a via layer adjacent to the first metal layer, the via layer conductive structure coupled to the first metal line in the first metal layer and having a length in the first direction greater than the second track pitch.

In another aspect, an exemplary method of fabricating an interconnect structure is disclosed. The method comprises forming a first metal layer comprising a first metal line in a first track among a plurality of tracks extending in a first direction, the plurality of tracks having a track pitch; and forming a second metal line in a second track among the plurality of tracks, the second track comprising an adjacent track next to the first track in a second direction orthogonal to the first direction. The method comprises forming a via layer conductive structure in a via layer adjacent to the first metal layer, the via layer conductive structure coupled to the first metal line and the second metal line and having a first length in the second direction greater than the track pitch.

BRIEF DESCRIPTION OF THE FIGURES

FIGS. 6A and 6B are a cross-sectional view and flowchart of a method in a fabrication stage for fabricating a first metal layer in an interconnect structure corresponding to the interconnect structures in FIGS. 2A-2C and 3A-3D;

DETAILED DESCRIPTION

Figure 1:
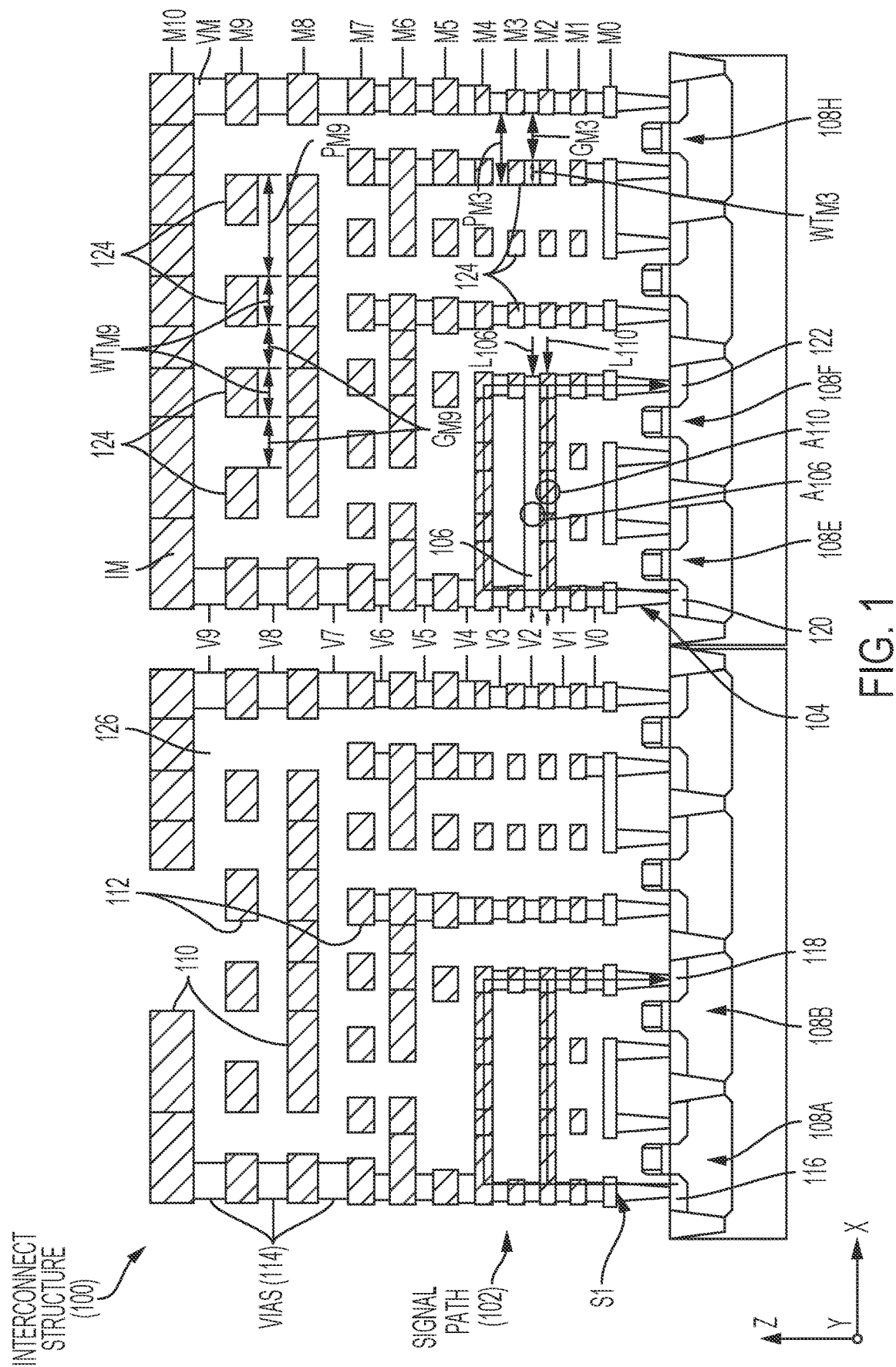
FIG. 1 is a cross-sectional side view of an interconnect structure including signal paths with and without an exemplary via layer conductive structure to reduce path resistance.

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

The via layer conductive structures in a signal path are disposed in respective via layers adjacent to a metal layer(s) that includes metal lines of the interconnect structure. The via layer conductive structures increase the conductive cross-sections of signal paths for signals through the interconnect structure between devices in an integrated circuit (IC) or from a device to an external contact (i.e., bump or pin) of the IC. The via layer conductive structures provide one or both of supplementing the height dimensions of metal lines and electrically coupling metal lines in different metal layers to increase the conductive cross-section of a signal path. The increased conductive cross-section of a signal path provided by the via layer conductive structures reduces resistance, which reduces current-resistance (IR) drop of signals (e.g., power signals) carried over the signal paths and also increases signal speed. As IC circuits are reduced in size, the metal track pitch for the metal lines in metal layers may also be reduced in size, which has the effect of increasing signal path resistance in the interconnect structure. In this regard, in exemplary aspects, to reduce or avoid an even greater increase in resistance in the signal paths as the metal track pitches in the interconnect structure are reduced, the via layer conductive structures are provided. One dimension of the via layer conductive structures extends farther than a metal track pitch in an adjacent metal layer in which metal tracks run orthogonal to the direction of current flow. The via layer conductive structures have the effect of reducing resistance in signal paths in the interconnect structure. In one exemplary aspect, a metal line in a first metal layer extends in a first direction and a via layer conductive structure is disposed on the metal line to effectively increase a height dimension of the metal line. The via layer conductive structure extends in the first direction a distance greater than the metal track pitch of a second metal layer adjacent to the first metal layer. In another exemplary aspect, a via layer conductive structure couples together a first metal line in a first track in a first metal layer and a second metal line in a next adjacent metal track in the first metal layer by extending from the first metal line to the second metal line in a via layer adjacent to the first metal layer. In another exemplary aspect, air gaps between metal lines in different signal paths reduce capacitance to improve signal path speed.

In this regard, FIG. 1 is a cross-sectional side view of an interconnect structure 100 that includes metal layers M0-M10 interleaved with intervening via layers V0-V9 for routing three-dimensional (3D) signal paths, such as signal path 102 and signal path 104. The signal path 104 includes an exemplary via layer conductive structure 106 to reduce resistance compared to the signal path 102. The exemplary via layer conductive structure 106 is better appreciated in light of the following discussion of aspects of the interconnect structure 100. The metal layers M0-M10 and the via layers V0-V9 are employed for routing connections between components (e.g., transistors) 108A-108H and from the components 108A-108H to external contacts (not shown). Although the interconnect structure 100 is shown in two (2) dimensions in FIG. 1, signal paths 102 and 104 may extend in three directions corresponding to the X, Y, and Z axes. For example, the metal layers M0, M2, M4, M6, M8, and M10 include metal lines 110 extending in the X-axis direction and the metal layers M1, M3, M5, M7, and M9 include metal lines 112 extending in the Y-axis direction. The metal lines 110 and 112 may also be referred to as traces, conductors, wires, or interconnects, for example. Vias 114 extend in the Z-axis direction to interconnect the metal lines 110 and the metal lines 112 to form the signal paths 102 and 104.

In FIG. 1, the terminal 116 of component 108A is coupled to the terminal 118 of component 108B by the signal path 102, and the terminal 120 of component 108E is coupled to terminal 122 of component 108F by signal path 104. A signal S1 may flow in the X-axis direction through metal lines 110 at metal layer M2 and M4 in the signal path 102. The metal lines 110 and vias 114 have electrical resistance based on resistivity of the metal of the conductive elements (i.e., metal lines 110 and vias 114). Resistance is also based on length and cross-sectional area of the conductive elements through which the signal S1 flows. The cross-sectional areas of the metal lines 110 in metal layers M2 and M4 are determined by respective thicknesses of the metal layers M2 and M4 and by track widths of metal tracks in which the metal lines 110 are formed. The track widths are based on track pitches that may be unique in each of the metal layers M0-M10.

The reason for including metal lines 110 of both metal layer M2 and metal layer M4 is better understood following a discussion of resistance in a signal path. The resistance R in a conductive element (e.g., metal lines 110 and 112) is proportional to the total length of the conductive element and inversely proportional the cross-sectional area of the conductive element. Resistance can create an "IR drop" which is a voltage loss based on a signal current "I" times a path resistance "R". The IR drop is a reduction in voltage over the length of the signal path. The voltage reduction corresponds to power being lost to the generation of heat. Increased resistance can also slow signal propagation. The length of the signal path between the components 108A-108H includes components in the X, Y, and Z-axis directions. The signal S1 may be a power signal having a large current component. Thus, minimizing the resistance R can significantly reduce any IR drop. On the other hand, signal paths that are critical paths of signals (e.g., control and data signals) can be made faster by reducing the resistance R to reduce timing delay associated with a resistance-capacitance (RC) delay.

Signal paths in the lowest levels of metal, closest to the components, are typically densely routed and have a minimum allowed metal line width. However, signal paths formed of very narrow metal lines in the lowest metal layers (e.g., M0, M1) may cause the IR drop or the RC signal delay to fail to meet design requirements. A conductive cross-section of a signal path can be increased to reduce resistance and meet such requirements.

In the signal path 102, the distance in the X-axis direction between terminal 116 and terminal 118 is the largest component of the signal length. Therefore, reducing path resistance in the X-axis direction improves the IR drop and signal speed of the signal S1. Here, the resistance is reduced by employing the metal line 110 in the metal layer M4 in addition to the metal line 110 in the metal layer M2 to provide parallel paths for the signal S1. Although the signal path length through the metal layer M4 is greater due to the Z-axis component, including the metal line 110 in the metal layer M4 may double the total conductive cross-sectional area compared to using only the metal line 110 in the metal layer M2, providing a significant reduction in resistance.

An alternative (not shown) to the configuration of signal path 102 would be to employ a second metal line 110 in the metal layer M2 but this option would consume more area in the densely routed lower metal layers, which is undesirable.

A limitation to the approach used in the signal path 102 in FIG. 1 is that the conductive cross-section in the signal direction (X-axis direction) can only be increased by using more metal lines 110 in metal layers in which the tracks extend in the X-axis direction. Referring now to the signal path 104, a conductive cross-section is increased by employing the via layer conductive structure 106 in the via layer V2 between the metal layers M2 and M3. In an exemplary aspect, the signal path 104 employs the via layer conductive structure 106. Rather than merely coupling metal lines 110 and 112 in different metal layers, the via layer conductive structure 106 is coupled to a surface of the metal line 110 in the metal layer M2 for a length $L_{106}$ of the via layer conductive structure 106 in the X-axis direction. The length $L_{106}$ is greater than the track pitch $P_{M3}$ of tracks 124 in the metal layer M3 and, in some examples, may be greater than twice the track pitch $P_{M3}$. The track pitch $P_{M3}$ is the sum of the track width $WT_{M3}$ in metal layer M3 and the gap $G_{M3}$ between tracks in the metal layer M3. In this manner, a cross-sectional area $A_{106}$ of the via layer conductive structure 106 adds to the cross-sectional area $A_{110}$ of the metal line 110 in the metal layer M2 and decreases the resistance of the signal path 104 compared to the otherwise similar signal path 102. In some examples, the metal line 110 in the metal layer M2 has a length $L_{110}$ corresponding to a multiple N of the track pitch $P_{M3}$ of the metal layer M3 and the length $L_{106}$ of the via layer conductive structure 106 corresponds to the multiple N times the track pitch $P_{M3}$.

The length $L_{106}$ being greater than the track pitch $P_{M3}$ illustrates a difference between the via layer conductive structures and the vias 114 in the via layers V0-V9 for interconnecting the metal layers M0-M10. The width dimensions of the vias 114 in the X-axis and Y-axis directions are limited by track pitches of the metal lines 110 and 112 in the metal layers M0-M10. As an example, the metal lines 112 in metal layer M9 are formed in tracks 124 that extend in the Y-axis direction. The tracks 124 have a track pitch $P_{M9}$ measured in the X-axis direction. The track pitch $P_{M9}$ is determined by a sum of a track width $WT_{M9}$ of a track 124 and a track separation gap $G_{M9}$ between adjacent tracks 124 in the X-axis direction. Two vias 114 placed side-by-side and centered on adjacent metal lines 112 in the metal layer M9 would overlap with each other, causing them to be electrically shorted to each other, if their dimension in the X-axis direction is equal to or greater than the track pitch $P_{M9}$.

The metal lines 110 and 112 of the metal layers M0-M10 are formed of an interconnect metal IM, such as copper (Cu). The vias 114 in the via layers V0-V9 are formed of a via metal VM, which may be the same or different from the interconnect metal IM. The interconnect metal IM may, in addition to or in the alternative to Cu, be any of ruthenium (Ru), cobalt (Co), and molybdenum (Mo). The via metal VM may include any of Ru, Mo, Co, Cu, and tungsten (W). The metal lines 110 and 112 and the vias 114 are formed in layers of an inter-metal dielectric (IMD) 126. The via layer conductive structure 106 may be formed of any one or more of Cu, Co, Ru, Mo, and W, and other conductive material(s).

Figure 2A:
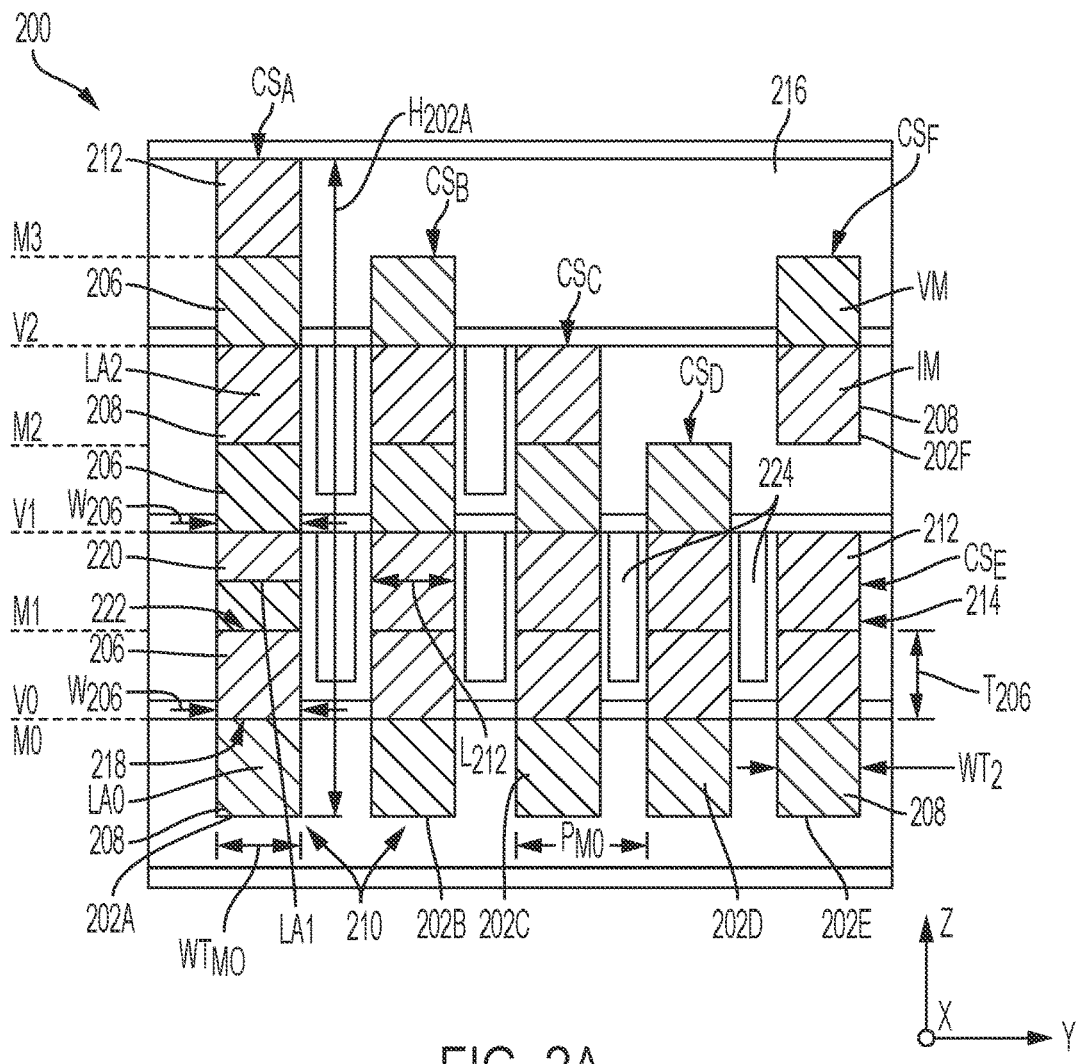
FIG. 2A is a cross-sectional side view of an interconnect structure including end views of signal paths having various conductive cross-sections including metal layers and via layer conductive structures for increased cross-sectional area and reduced resistance.

FIG. 2A is a cross-sectional side view of an interconnect structure 200 including signal paths 202A-202F having conductive cross-sections $CS_A$-$CS_F$. The interconnect structure 200 includes metal layers M0-M3 and via layers V0-V2. FIG. 2A is provided to illustrate that signal paths 202A-202F including the via layer conductive structures 206 may be formed to have a range of conductive cross-sections $CS_A$-$CS_F$ in the interconnect structure 200. The conductive cross-sections $CS_A$-$CS_F$ are merely examples and not limitations as signal paths with larger cross-sections may be formed. The description of FIG. 2A below is directed to structures forming conductive cross-sectional area of the signal paths 202A-202F formed in the metal layers M0-M3 and the via layers V0-V2. The view in FIG. 2A is an end view in the direction of current flow in each of the signal paths 202A-202F. The metal layers M0-M3 may be any four consecutive metal layers in an interconnect structure and the interconnect structure 200 is not limited to four metal layers. The metal layer M0 includes metal lines 208 in a plurality of metal tracks 210 that extend in a first direction and have a track width $WT_{M0}$. The metal layer M1, adjacent to the metal layer M0, includes metal lines 212 in a plurality of metal tracks 214 (see also FIG. 2C) that extend in a second direction orthogonal to the first direction and have a track width $WT_{M1}$ (see FIG. 2C). The metal tracks 210 in FIG. 2A extend in the X-direction and have a track pitch Pro in the Y-axis direction. The metal tracks 214 may extend in the Y-direction and have a track pitch (not shown) in the X-axis direction. The metal layer M2 includes metal lines 208 in metal tracks 210 with a width $WT_2$ and the metal lines 208 extend in the first direction. The metal layer M3, adjacent to the metal layer M2, includes metal lines 212 in metal tracks 214 (see FIG. 2C) that extend in a second direction orthogonal to the first direction. The term "extend in a direction" with regard to a direction of the metal tracks 210 or the metal tracks 214 refers to directions of longitudinal axes of the metal tracks 210 and 214. The term "adjacent to" as used herein refers to, for example, a first layer being next in a given direction to a second layer and may or may not include intervening layers of another type. For example, the metal layer M2 is adjacent to metal layers M1 and M3 despite the intervening via layers V1 and V2 because metal layer M1 is a next metal layer in one direction and metal layer M3 is a next metal layer in another direction. The via layers V1 and V2 are also adjacent to the metal layer M2 as they are next to, in opposite directions, the metal layer M2.

The metal lines 208 and the metal lines 212 are formed of an interconnect metal IM. The interconnect metal IM of the metal layers (e.g., M0-M3) may be any one or more of Cu, Ru, Co, and Mo. Forming the metal layers M0-M3 includes forming the metal lines 208 and 212 in layers of an IMD 216. The via layers V0-V2 may include vias (not shown) formed of a via metal VM. The via metal VM may include any one or more of Cu, Co, Ru, Mo, and W, and other conductive material(s). The interconnect structure 200 includes the via layer conductive structures 206 in the via layer V0 adjacent to the metal layer M0. The via layer conductive structure 206 is coupled to the metal line 208 in the metal layer M0 and has a length $L_{206}$ (see FIG. 2C) in the X-axis direction greater than the second track pitch Pmt. The via layer conductive structure 206 is also formed of the via metal VM. The via layer conductive structures 206 has a thickness $T_{206}$ corresponding to a thickness of the via metal layer V0 and has a width $W_{206}$ in the Y-axis direction corresponding to the track width $WT_{M0}$. The via layer conductive structures 206 are included in the signal paths 202A-202F to increase the conductive cross-sectional areas between stacked parallel metal lines extending in the direction of current flow.

The metal lines 212 extend in the Y-axis direction and have a width (not shown) corresponding to a track width $WT_{M1}$ of the tracks 214 in the X-axis direction. A length $L_{212}$ of the metal lines 212 in the signal paths 202A is based on the track width $WT_{M0}$ in the Y-axis direction of the metal lines 208. Current flow in a metal line is typically in the longitudinal direction of the metal line. However, the direction of signal flow through the metal lines 212 is in the X-axis direction across the metal lines 212, not in the Y-axis direction along the longitudinal axis LA1. Some structures of the via layer conductive structures 206, within the via layers V0-V2 and the metal layers M0-M3, may be formed of the interconnect metal IM but may not be employed for current flow along their longitudinal axes. In this regard, the term "interconnect metal elements" may refer to any three-dimensional feature of the signal paths 202-202F that is formed of the interconnect metal IM, whether in one of the metal layers M0-M3 or in one of the via layers V0-V2, and provides additional conductive cross-section for the signal paths 202A-202F. The metal lines 208, the metal lines 212, and other features formed (e.g., in the metal layers or the via layers) of the interconnect metal IM may be referred to as interconnect metal elements.

As disclosed below, the via layer conductive structures 206 may be formed entirely of the via metal VM or formed partially of interconnect metal elements and partially of three-dimensional features of the via metal VM. Features formed of the via metal VM may be referred to herein as via metal elements. The term via metal elements may include vias, entire via layer conductive structures, and features of via layer conductive structures.

Returning to FIG. 2A, the metal tracks 210 in the metal layer M2 and the via layer conductive structures 206 in via layers V0-V2 also have the track width $WT_{M0}$ so the conductive cross-sectional area $CS_A$ of the signal path 202A may be determined by the track width $WT_{M0}$ and the height H$_{202A}$. As shown, the signal paths 202B-202F are each formed of a subset of layers in the signal path 202A, and thus are not described separately.

With regard to the individual layer, at the bottom layer in FIG. 2A the signal path 202A includes a metal line 208 in the metal layer M0. The longitudinal axis LA0 of the metal track 210 in metal layer M0 extends in the X-axis direction, which is the direction of current or signal flow. As such, the view of the metal line 208 in the metal layer M0 is an end view showing a conductive cross-section of the metal line 208. Each of the signal paths 202B-202F also includes a corresponding metal line 208 in the metal layer M0.

A next layer in the signal path 202A includes a via layer conductive structure 206 including the via metal VM formed in the via layer V0 on a surface (e.g., top surface in the Z-axis direction) 218 of the metal line 208 in the metal layer M0. The expression "on a surface" with regard to, for example, the via layer V0 on a surface 218 of the metal line and as otherwise used herein, is intended to mean that the via layer V0, in this example, is in contact with the metal line. In this regard, the via layer V0 being in contact with the metal line 208 causes the via layer V0 to be electrically coupled to the metal line and "in contact with" in this regard may indicate the via layer V0 is in direct contact (i.e., without one or more intervening layers) or in indirect contact, which may include one or more intervening layers. The via layer conductive structure 206 has a width in the Y-axis direction of the track width WT$_{M0}$. The via layer conductive structure 206 may include a single via metal element or a combination of one or more via metal elements and one or more interconnect metal elements.

The signal path 202A further includes an interconnect metal element 220, which is one of the metal lines 212 in the metal layer M1. The interconnect metal element 220 in the metal layer M1 is on a top surface 222, in the Z-axis direction in FIG. 2A, of the via layer conductive structure 206 in via layer V0.

The signal path 202A further includes the via layer conductive structure 206 in the via layer V1. The via metal VM of the via layer conductive structure 206 in via layer V1 is formed on the metal line 212 in the metal layer M1 and has a width in the Y-axis direction (i.e., of the longitudinal axis LA1) of the track width WT$_{M0}$. The via layer conductive structure 206 in the layer V1 may include a single via metal element or a plurality of via metal elements and a plurality of interconnect metal elements.

Features of the signal path 202A in the metal layer M2, the via layer V2, and the metal layer M3 duplicate the features described above in the metal layer M0, via layer V0, and metal layer M1. In this regard, the signal path 202A further includes the metal line 208 in the metal layer M2 corresponding to the metal line 208 in the metal layer M0. The metal line 208 in the metal layer M2 has a longitudinal axis LA2 in the X-axis direction and has a width in the Y-axis direction based on the track width WT$_{M0}$. The signal path 202A further includes a via layer conductive structure 206 in the via layer V2 corresponding to the via layer conductive structure 206 in the via layer V0, and a metal line 212 in the metal layer M3 corresponding to the metal line 212 in the metal layer M1.

It should be noted, as shown in FIG. 1, that a higher metal layer (e.g., farther from the components of an IC in the Z-axis direction) may have a wider track pitch and greater thickness than lower metal layers, and therefore wider metal lines 208 or 212. Thus, the conductive cross-section provided by a higher metal layer may be greater in area than the lower metal layer. The signal paths 202B-202E having fewer layers than signal path 202A are successively smaller in the Z-axis direction which may be due to different resistance requirements of those particular signal paths. A signal path as disclosed herein may not include a metal line 208 in the metal layer M0 and may instead have a lowest metal line in another metal layer (e.g., M1-M3). As an example, the signal path 202F includes only a metal line 208 in the metal layer M2 and a via layer conductive structure 206 in the via layer V2.

Another exemplary feature of the interconnect structure 200 in FIG. 2A is air gaps 224 separating the signal paths 202A-202E. The signal paths 202A-202F are formed successively in layers of the IMD 216. The dielectric constant of air may be lower than a dielectric constant of the IMD 216, so the capacitance between the signal path 202A and the signal path 202B, for example, may be reduced by the air gaps 224. Reducing capacitance between the signal paths 202A and 202B may improve signal propagation speed through the signal paths 202A and 202B.

Figure 2B:
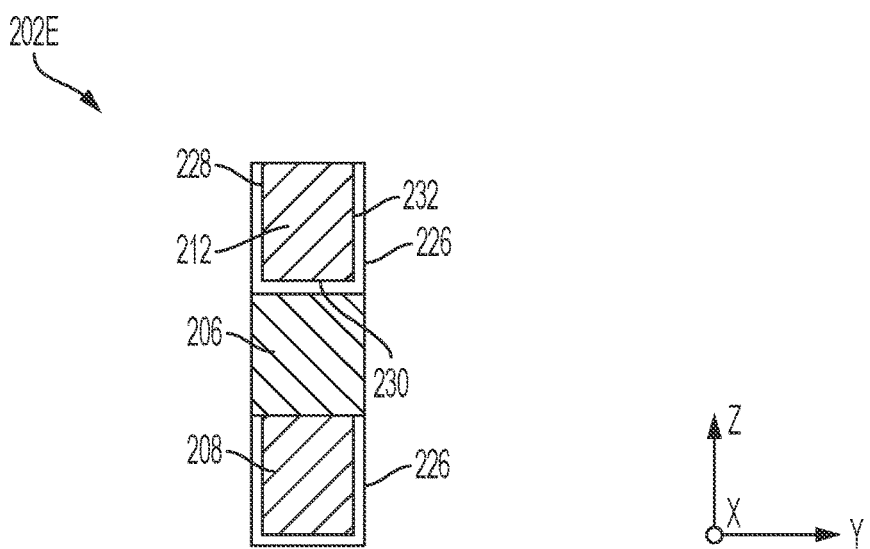
FIG. 2B is a cross-sectional side view of one of the interconnect structures in FIG. 2A showing a barrier layer on the metal layers.

FIG. 2B is a close-up, detailed view of the signal path 202E in FIG. 2A. FIG. 2B is provided to show that a barrier/seed layer 226 may be provided on side and bottom surfaces 228, 230 and 232 of the metal lines 208 and 212 that abut the IMD 216 (see FIG. 2A) or the via layer conductive structure 206. Any other interface between an interconnect metal element and the IMD 216 or a via metal element in an interconnect structure as described herein may also optionally include the barrier/seed layer 226. The barrier/seed layer 226 is provided to reduce or avoid diffusion of the interconnect metal IM into or through the IMD 216 or the via metal element of the via layer conductive structure 206. The barrier/seed layer 226 may include tantalum nitride (TaN) and/or titanium nitride (TiN). The total conductive cross-section of the signal path 202E includes the metal lines 208 and 212 together with the via layer conductive structure 206. Herein, where metal lines corresponding to the metal lines 208 and 212 are described as being "on" or "on a surface of" a via layer conductive structure 206, for example, the metal lines may or may not include an intervening barrier/seed layer such as the barrier/seed layer 226 in FIG. 2B.

Figure 2C:
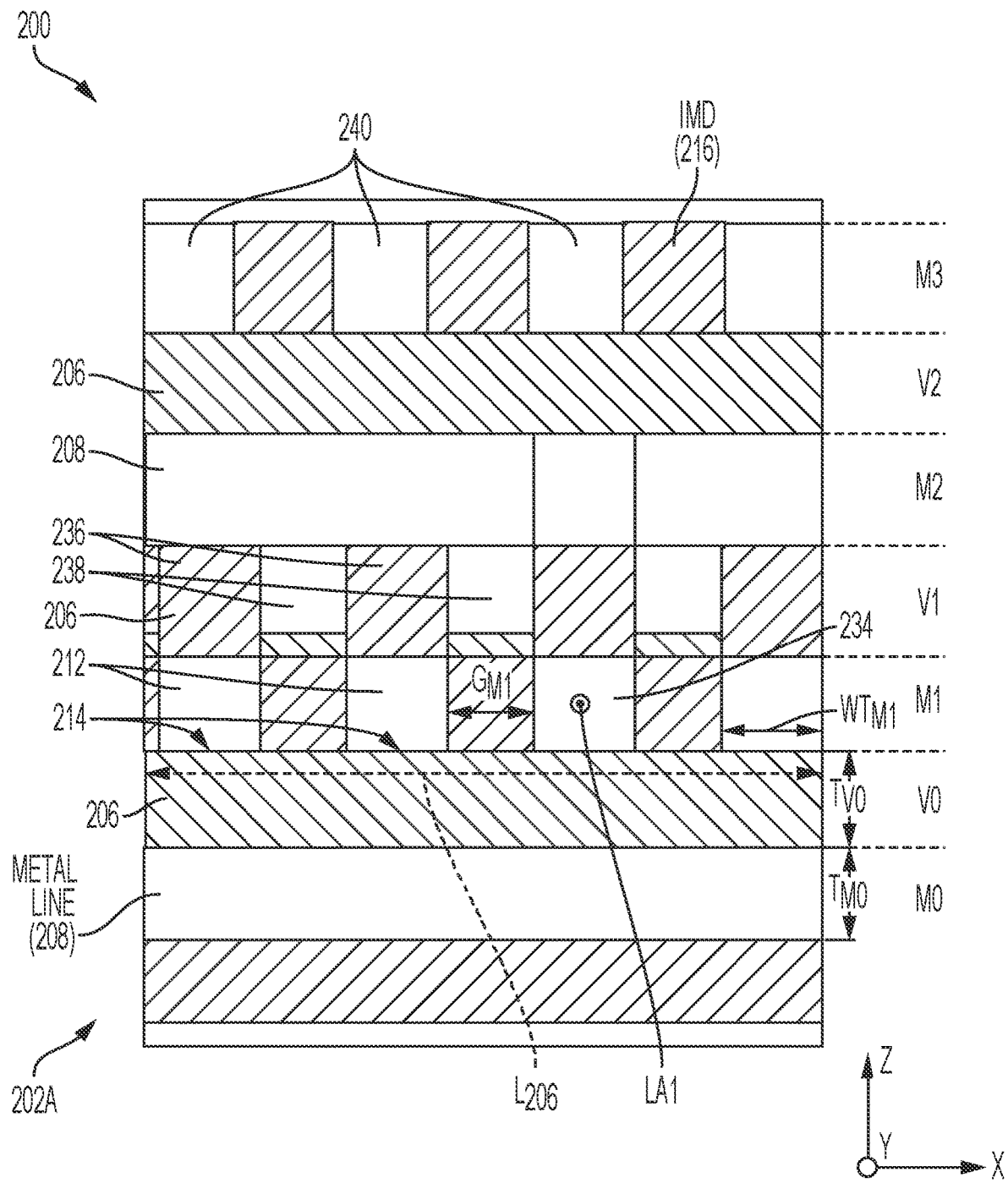
FIG. 2C is a cross-sectional side view of the signal path in the interconnect structure in FIG. 2A in a direction orthogonal to signal flow to further illustrate the via layer conductive structures.

FIG. 2C is a cross-sectional side view of the signal path 202A in the interconnect structure 200 in FIG. 2A in a direction orthogonal to signal flow to further illustrate the via layer conductive structures. The cross-sectional view of the signal path 202A in FIG. 2A corresponds to a cross-section taken from the right end of the structure shown in FIG. 2C and looking left in the X-axis direction.

The metal line 208 in the metal layer M0 extends in the direction of current flow in the signal path 202A. The via layer conductive structure 206 in the via layer V0 includes a single via metal element disposed on a surface (e.g., top surface in the Z-axis direction) of the metal line 208 in the metal layer M0. In this regard, the via layer conductive structure 206 in the via layer V0 essentially doubles the conductive cross-section of the metal line 208, assuming a thickness T$_{V0}$ of the via layer V0 corresponds to a thickness T$_{M0}$ of the metal layer M0.

The metal layer M1 includes a plurality of the metal tracks 214. The metal lines 212 in the metal layer M1 are referred to in FIG. 2C as a plurality of interconnect metal elements 234 disposed in a plurality of consecutive metal tracks 214 in the metal layer M1. The metal lines 212 are separated by the track separation gap G$_{M1}$, which is filled with the IMD 216. The interconnect metal elements 234 are shown in an end view in the direction of the longitudinal axis LA1 in FIG. 2C.

The via layer conductive structure 206 in the via layer V1 is disposed on the metal layer M1. The via layer conductive structure 206 includes a plurality of consecutive via metal elements 236 disposed on the plurality of interconnect metal elements 234. The via layer conductive structure 206 also includes a second plurality of interconnect metal elements 238 each disposed between adjacent via metal elements 236 among the plurality of via metal elements 236. Each of the interconnect metal elements 238 is coupled to the adjacent via metal elements 236 in the via layer conductive structure 206. The direction of signal flow in the X-axis direction in the via layer V1 extends alternately through the via metal elements 236 and the interconnect metal elements 238. The metal line 208 in the metal layer M2 is disposed in a metal track 210 (not shown) on the via layer conductive structure 206 in the via layer V1.

As shown in FIG. 2C, the metal line 208 in the metal layer M2 corresponds to the metal line 208 in the metal layer M0. Similarly, the via layer conductive structure 206 in via layer V2 corresponds to the via layer conductive structure 206 in via layer V0, and a plurality of interconnect metal elements 240 in the metal layer M3 correspond to the interconnect metal elements 234 in the metal layer M1.

The features of the signal path 202A in the layers M0, V0, M1, and V1 in the order shown in FIGS. 2A and 2C may be repeated in consecutive vertical layers to form a signal path with additional vertical height and cross-sectional area. The via layer conductive structure 206 in via layer V1 in FIG. 2C may be formed on metal lines or interconnect metal elements in a metal layer in which the metal tracks extend orthogonal to or in the direction of signal propagation. A bottom layer of a signal path may correspond to either the metal layers M0 and M2 or the metal layers M1 and M3. The signal path may include any number of layers, as desired.

Figure 3A:
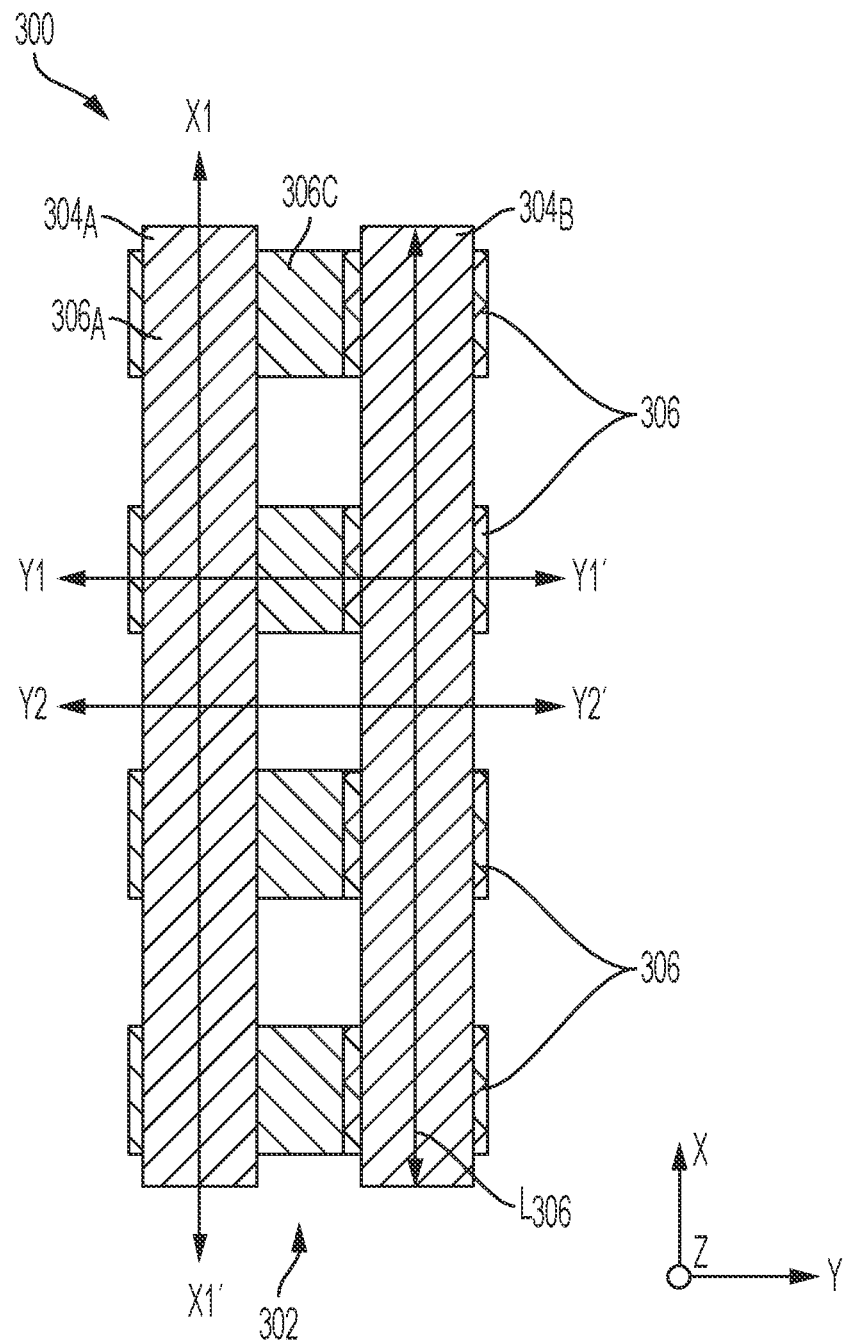
FIG. 3A is a top view of an interconnect structure including via layer conductive structures and parallel signal paths for increased conductive cross-sectional area to reduce resistance.

FIG. 3A is a top view of an interconnect structure 300 providing a signal path 302 including conductive structures $304_A$ and $304_B$ and a plurality of via layer conductive structures 306. The conductive structures $304_A$ and $304_B$ are parallel to each other and are electrically coupled to increase the total conductive cross-sectional area of the signal path 302 for signal or current flow in the X-axis direction. Each of the conductive structures $304_A$ and $304_B$ may individually correspond to one of the signal paths 202A-202F in FIG. 2A. The signal path 302 includes a first via layer conductive structure 306A with a length $L_{306}$, which is a first type of via layer conductive structure 306 corresponding to the via layer conductive structure 206 in via layers V0 and V2 in FIG. 2C. A second via layer conductive structure 306B (not shown in FIG. 3A) is a second type of via layer conductive structure that corresponds to the via layer conductive structure 206 in the via layer V1 in FIG. 2C. The first and second via layer conductive structures 306A and 306B provide conductive cross-sectional area in parallel to a metal line extending in a direction of current flow for at least a distance greater than a track pitch of an adjacent metal layer. The first via layer conductive structure 306A is employed as a top layer of each of the conductive structures $304_A$ and $304_B$ in FIG. 3A. The interconnect structure 300 also includes a third via layer conductive structure 306C, which is a third type of the via layer conductive structures 306. The third via layer conductive structure 306C extends orthogonal to and couples to both of the conductive structures $304_A$ and $304_B$. Further details of the first via layer conductive structures 306A, the second via layer conductive structures 306B, and the third via layer conductive structures 306C are provided with reference to FIGS. 3B-3D, which illustrate cross-sectional side views along lines Y1-Y1', Y2-Y2', and X1-X1' in FIG. 3A.

Figure 3B:
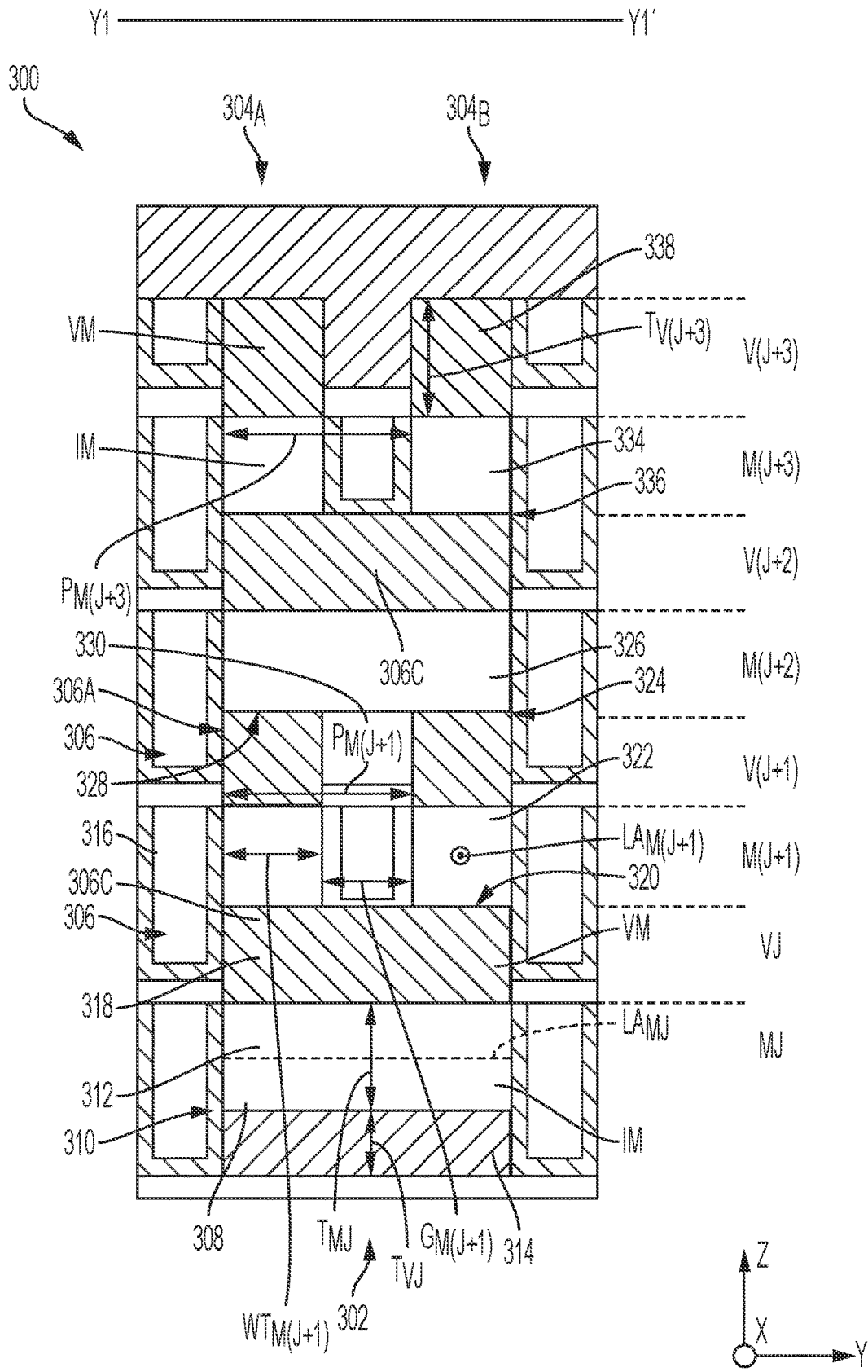
FIG. 3B is a first cross-sectional view in the direction of signal flow in the interconnect structure in FIG. 3A to illustrate the cross-sectional area increase provided by via layer conductive structures and interconnected metal lines.

FIG. 3B illustrates a cross-sectional side view of the signal path 302 taken at line Y1-Y1' in FIG. 3A. FIG. 3B is a cross-section viewed in the X-axis direction (i.e., the direction of current flow) and shows features in a plane extending in the X-axis and Z-axis directions. FIG. 3B is provided to show how the conductive structures $304_A$ and $304_B$ can be coupled together in parallel to provide a larger conductive cross-section for reducing resistance in the signal path 302. FIG. 3B shows that each of the conductive structures $304_A$ and $304_B$ include metal layers MJ through M(J+3) ("MJ-M(J+3)"). In this example, "3" could be any number "K" and J and K are both positive integers. Where J=0, the metal layers MJ-M(J+3) correspond to the metal layers M0-M3 of the signal paths 202A-202F in FIGS. 2A and 2C. The signal path 302 also includes via layers VJ-V(J+3), with via layers VJ-V(J+2) corresponding to the via layers V0-V2 in FIGS. 2A and 2C. The via layers VJ-V(J+3) are interleaved with the metal layers MJ-M(J+3) and each include one of the via layer conductive structures 306. The signal path 302 is described layer by layer beginning with the bottom layer (i.e., in the Z-axis direction) shown in FIG. 3B, which would be closest to a component layer (not shown) in an IC. The signal path 302 has as the bottom layer MJ having tracks extending in the Y-axis direction, but it should be noted that the signal path 302 could alternatively have any metal layer as the bottom layer MJ and can extend up to a desired vertical height in the order of layers shown.

A metal line 308 has a longitudinal axis $LA_{MJ}$ that extends, orthogonal to the direction of current flow, in the Y-axis direction in a metal track 310 in the metal layer MJ. Thus, the direction of current flow is across a track width (not shown) of the metal track 310. The metal line 308 in the metal layer MJ is also referred to as an interconnect metal element 312 formed of an interconnect metal IM which may include any one or more of Cu, Ru, Co, Mo having a metal layer thickness $T_{MJ}$. The metal line 308 in the metal layer MJ is formed on an IMD 314. Each end of the metal line 308 in the metal layer MJ is isolated from an adjacent signal path in the same metal layer MJ by air gaps 316. The air gaps 316 provide reduced capacitance between adjacent signal paths compared to the IMD 314. In the example of a signal path 302 in FIG. 3A, air gaps 316 are formed at each of the metal layers and via layers.

In via layer VJ, the third via layer conductive structure 306C includes a via metal element 318 formed of a via metal VM on the metal line 308. The via metal VM may be any one or more of Cu, Ru, Co, Mo, and W. The via metal element 318 has a thickness $T_{VJ}$ of the via layer VJ. There may be a barrier/seed layer (not shown) formed on surfaces of the metal line 308 before formation of the via metal VM. The third via layer conductive structure 306C is considered to be "on" the metal line 308 whether the barrier/seed layer is present or not. The metal line 308 in the metal layer MJ and the third via layer conductive structure 306C in the via layer VJ provide conductive cross-sectional area in each of the conductive structures $304_A$ and $304_B$ and also couple together the conductive structures $304_A$ and $304_B$. The via layer VJ is adjacent to the metal layer MJ and also adjacent to the metal layer M(J+1). The third via layer conductive structure 306C (via metal element 318) in the via layer VJ extends across the track width $WT_{M(J+1)}$ of the metal line 322 in the conductive structure $304_A$, across the track separation gap $G_{M(J+1)}$ between the conductive structure $304_A$ and the conductive structure $304_B$, and across the track width $WT_{M(J+1)}$ of the metal line 322 in the conductive structure $304_B$. In this regard, the third via layer conductive structure 306C in the via layer VJ extends a greater distance in the Y-axis direction than the track pitch $P_{M(J+1)}$ of the metal tracks 320 to couple together the metal lines 322 in the metal layer M(J+1) and to add conductive cross-sectional area to both of the conductive structures $304_A$ and $304_B$ to reduce resistance of the signal path 302. The via metal element 318 is also part of the second via layer conductive structure 306B (not shown here) extending in the X-axis direction in the via layer VJ, as described further with regard to FIG. 3D.

In the metal layer M(J+1), metal tracks 320 have longitudinal axes $LA_{M(J+1)}$ in the direction of current flow in the X-axis direction. Thus, the metal lines 322 are viewed in an end view. The metal tracks 320 have a track pitch $P_{M(J+1)}$ that is determined by the sum of a track width $WT_{M(J+1)}$ and a track separation gap $G_{M(J+1)}$, both of which are measured in the Y-axis direction. The metal lines 322 are formed of the interconnect metal IM. The metal lines 322 are electrically coupled to the via metal element 318. The metal lines 322 may be separated by the IMD 314 or by the air gaps 316.

In a via layer V(J+1), one of the first via layer conductive structures 306A extending in the direction of current flow is formed on each of the metal lines 322 and includes the via metal 318. A barrier/seed layer (not shown) may first be included on the metal lines 322. The first via layer conductive structure 306A in the via layer V(J+1) extends in the X-axis direction, which is the longitudinal direction of the metal tracks 320 in the metal layer M(J+1).

A metal layer M(J+2) is formed on the via layer V(J+1). The metal layer M(J+2) is similar to the metal layer MJ in that metal tracks 324 of the metal layer M(J+2) have longitudinal axes extending the Y-axis direction, like the metal tracks 310 in the metal layer MJ. The metal layer M(J+2) includes an interconnect metal element 326 (e.g., metal line 326) in the metal track 324 in FIG. 3B. The metal line 326 comprises the interconnect metal IM on the first via layer conductive structure 306A in the conductive structure $304_A$ and on the first via layer conductive structure 306A in the via layer V(J+1) in the conductive structure $304_B$. The metal line 326 spans the track separation gap $G_{M(J+1)}$. In this manner, the metal line 326 couples to the top surfaces 328 of the first via layer conductive structures 306A in the respective conductive structures $304_A$ and $304_B$.

Prior to formation of the metal line 326, a region 330 of the via layer V(J+1) between the first via layer conductive structures 306A may be filled with the IMD 314, as described further below. To further increase the cross-sectional area of the signal path 302 in the via layer V(J+1), the IMD 314 may be removed, and forming the metal line 326 may include filling the region 330 with the interconnect metal IM in the third via layer interconnect structure 306C in the track separation gap $G_{M(J+1)}$ to couple the first via layer conductive structure 306A in the conductive structure $304_A$ to the first via layer conductive structure 306A in the conductive structure $304_B$ within the via layer V(J+1). Filling the region 330 with the interconnect metal IM may correspond in some aspects to the interconnect metal elements 238 in FIG. 2C.

The via layer V(J+2) adjacent to the metal layer M(J+2) includes a third via layer conductive structure 306C disposed on the metal line 326. In this regard, the via layer V(J+2) corresponds to the third via layer conductive structure 306C in the via layer VJ. The metal layer M(J+3) adjacent to the via layer V(J+2) includes metal lines 334 in metal tracks 336 having a track pitch $P_{M(J+3)}$. The third via layer conductive structure 306C in the via layer V(J+2) extends farther in the Y-axis direction than the track pitch $P_{M(J+3)}$ of the metal tracks 336. In other words, a length of the third via layer conductive structure 306C on the metal line 326 is greater than track pitch $P_{M(J+3)}$. A portion of the third via layer conductive structure 306C in the via layer V(J+2) is visible in the track separation gap $G_{M(J+1)}$ between the conductive structures $304_A$ and $304_B$ in the top view illustrated in FIG. 3A.

The via layer V(J+3) includes the first via layer conductive structures 306A comprising the via material VM having a thickness $T_{V(J+3)}$ over the length (not shown) of the metal lines 338 in the X-axis direction. The first via layer conductive structures 306A increase the conductive cross-section of each of the conductive structures $304_A$ and $304_B$ to reduce resistance of the signal path 302. The first via layer conductive structures 306A in the via layer V(J+3) correspond in other aspects to the first via layer conductive structures 306A in via layer V(J+1). The first via layer conductive structures 306A in the via layer V(J+3) are visible in the top view in FIG. 3A.

Figure 3C:
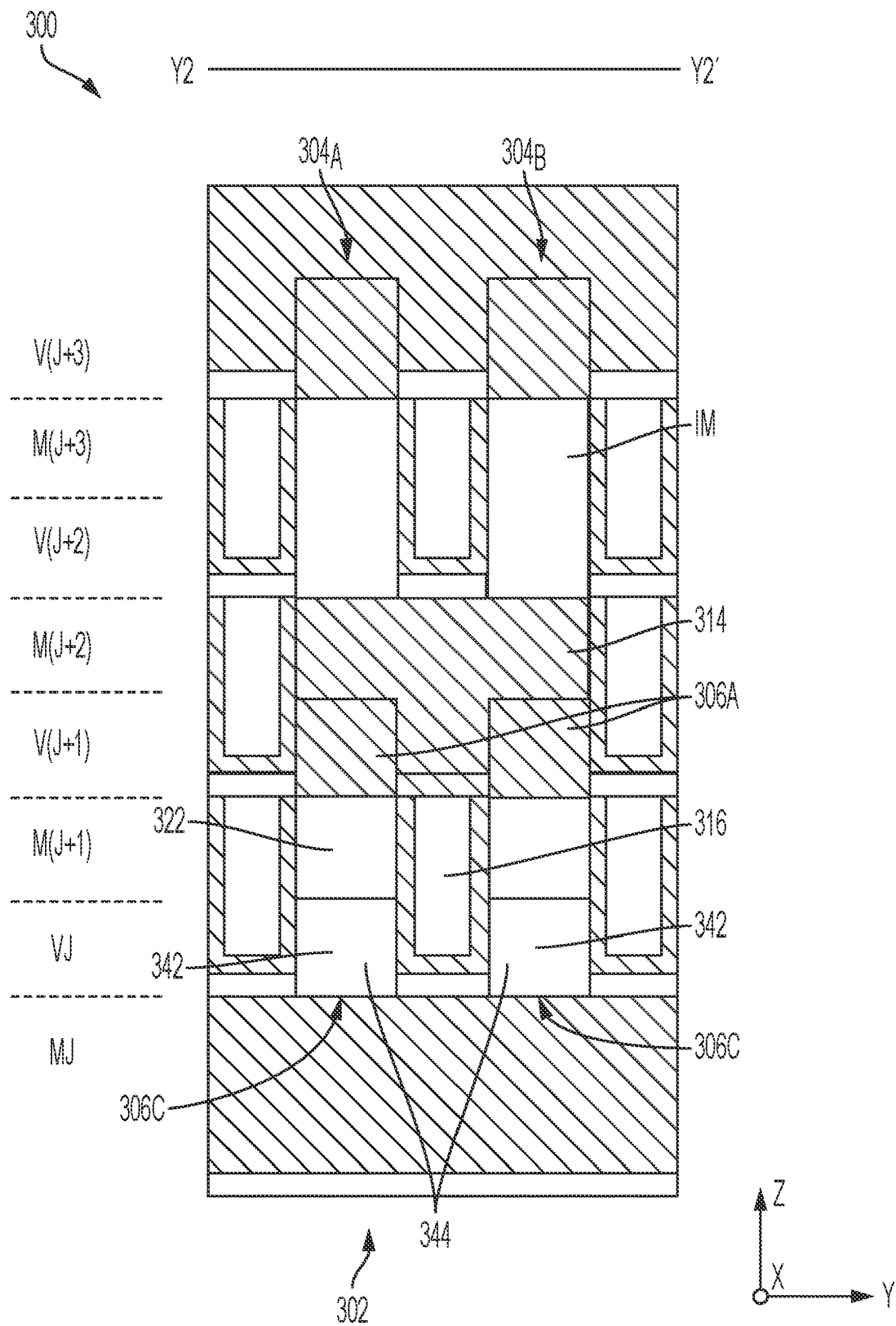
FIG. 3C is a second cross-sectional view in the direction of signal flow in the interconnect structure in FIGS. 3A-3B to illustrate the cross-sectional area increase provided by via layer conductive structures and interconnected metal lines.

FIG. 3C is a cross-sectional side view of the signal path 302 at the line Y2-Y2' in FIG. 3A, which is a view in the X-axis direction of a plane extending in the directions of the Y and Z axes. The layers of the view in FIG. 3C are described in ascending order, as in the description of FIG. 3B.

The cross-section in FIG. 3C extends between the third via layer conductive structures 306C in FIG. 3A. Thus, at the metal layer MJ, the cross-sectional side view in FIG. 3C shows the IMD 314, the medium in which the respective layers of the interconnect structure 300 are formed.

The cross-section in FIG. 3C extends through a region 342 in each of the conductive structures $304_A$ and $304_B$. The regions 342 are filled with the interconnect metal IM to form an interconnect metal element 344 during formation of the metal layer M(J+1). An air gap 316 is included in the via layer VJ between the regions 342 in the respective conductive structures $304_A$ and $304_B$. The region 342 is also shown in FIG. 3D.

In metal layer M(J+1), the view in FIG. 3C corresponds to the view in FIG. 3B, showing the metal lines 322 extending in the X-axis direction and separated by the track separation gap $G_{M(J+3)}$ (shown in FIG. 3B), which includes the air gap 316. In via layer V(J+1), the first via layer conductive structures 306A extend in each of the conductive structures $304_A$ and $304_B$. The IMD 314 remains in the via layer V(J+1) between the respective via layer conductive structures 306. The IMD 314 is also in the metal layer M(J+2) between the metal lines 326 in FIG. 3B.

As noted with regard to FIG. 3B, the via layer V(J+2), the metal layer M(J+3), and the via layer V(J+3) are similar, respectively, to the via layer VJ, the metal layer M(J+1), and the via layer V(J+1). Thus, the features in the via layer V(J+2), the metal layer M(J+3), and the via layer V(J+3) in FIG. 3C are similar to those of the via layer VJ, the metal layer M(J+1), and the via layer V(J+1) in FIG. 3C.

Figure 3D:
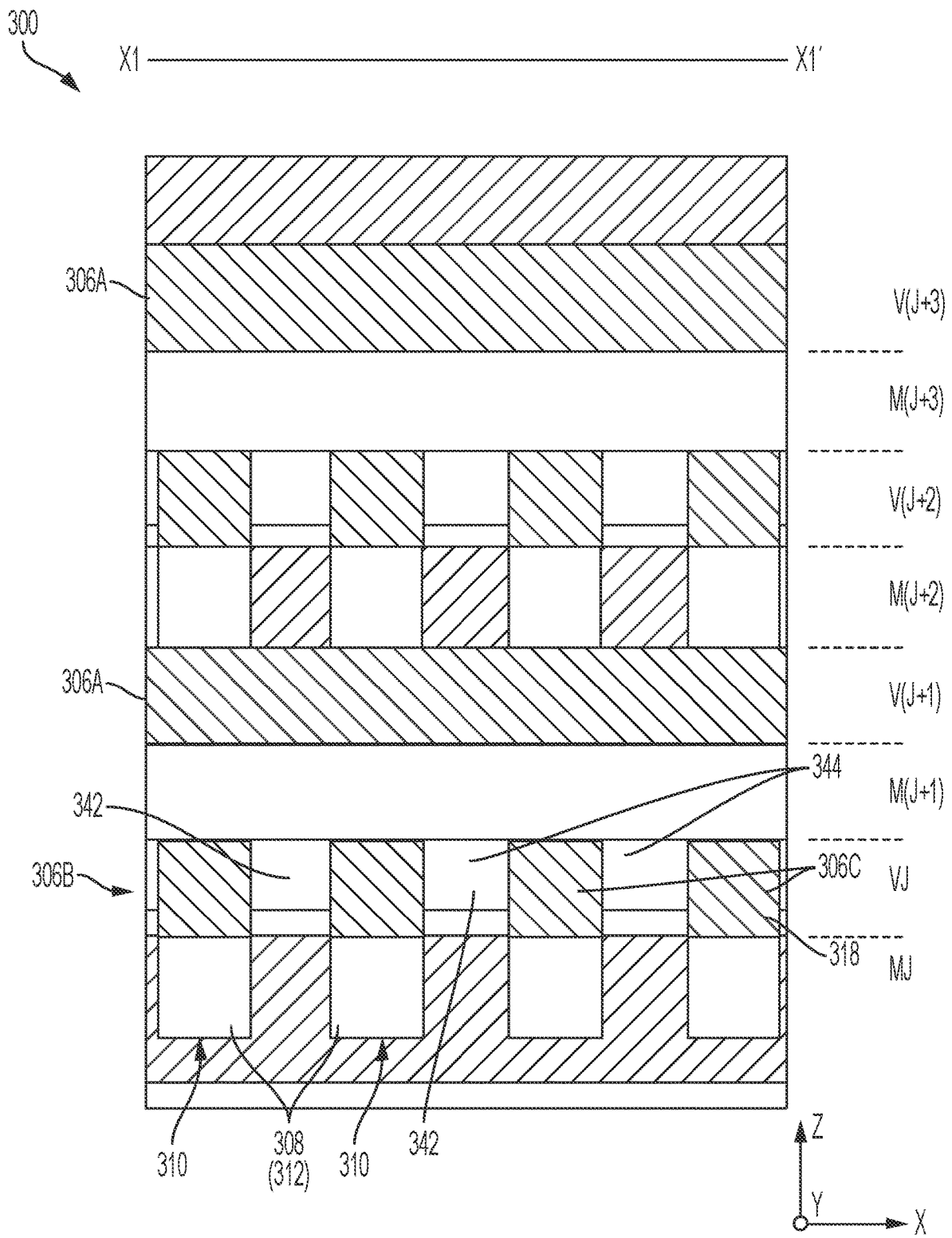
FIG. 3D is a cross-sectional side view of the interconnect structure in FIGS. 3A-3C in a direction orthogonal to signal flow to further illustrate the via layer conductive structures.

FIG. 3D is a cross-sectional side view of the signal path 302 at the line X1-X1' in FIG. 3A, orthogonal to the direction of signal (e.g., current) flow. FIG. 3D is a view in the Y-axis direction of a plane extending parallel to the X-axis and Z-axis directions. A sequence of the metal layer MJ, via layer VJ, metal layer M(J+1), and via layer V(J+1) in FIG. 3D correspond respectively to the metal layer M1, via layer V1, metal layer M2, and via layer V2, in FIG. 2C. The sequence of metal layers including metal tracks extending in the direction of or orthogonal to the direction of signal flow and the via layer conductive structures in the intervening via layers in FIG. 3D is the same as in FIG. 2C. The primary distinctions between FIG. 3D and FIG. 2C is that FIG. 3D is a cross-sectional view that corresponds to each of the two conductive structures $304_A$ and $304_B$ (shown in FIGS. 3B and 3C) formed on adjacent metal tracks and coupled together by metal lines 308, whereas all of the signal path 202A is formed on a single metal track. The conductive structures $304_A$ and $304_B$ also have an additional via layer compared to the signal path 202A.

FIG. 3D shows an end view of the metal lines 308 in the metal layer MJ, as the metal tracks 310 extend in the Y-axis direction. The metal lines 308 are formed in metal tracks 310 that extend orthogonal to the direction of current flow and are also referred to herein as interconnect metal elements 312. FIG. 3D shows that the signal path 302 includes at least four (4) interconnect metal elements 312 in the metal layer MJ to couple the conductive structures $304_A$ and $304_B$. The interconnect metal elements 312 could be extended to couple to more conductive structures (not shown) to provide additional conductive cross-section for the signal path 302. FIG. 3D may represent only a portion of the signal path 302 in the X-axis direction. In this regard, the signal path 302 may be longer in the X-axis direction and include more interconnect metal elements 312 in the metal layer MJ. The signal path 302 may also have more layers in the Z-axis direction by including more metal layers and via layers continuing the sequence shown in FIGS. 2A, 2B, and 3A-3C. The signal path 302 may also be shorter in the X-axis direction and include fewer than four interconnect metal elements 312 in the metal layer MJ.

In FIG. 3D, the third via layer conductive structures 306C (i.e., the via metal elements 318) in via layer VJ are shown from an end view and the second via layer conductive structures 306B are shown in a side view. A plurality of consecutive via metal elements 318 comprising the via metal VM are disposed on the plurality of interconnect metal elements 312 in the metal layer MJ. The via metal elements 318 are spaced apart in the X-axis direction. FIG. 3D also shows the regions 342 in the via layer VJ, between the third via layer conductive structures 306C, where the interconnect metal IM is deposited during formation of the metal line 322 in the metal layer M(J+1). The interconnect metal IM in the regions 342 between the via metal elements 318 forms interconnect metal elements 344 that couple the respective third via layer conductive structures 306C to each other and also couples to the metal line 322 in the metal layer M(J+1). In this regard, the via metal elements 318 together with the interconnect metal elements 344 form the second via layer conductive structures 306B.

In the via layer V(J+1), the first via layer conductive structure 306A extends in the X-axis direction top of the metal line 322 in the metal layer M(J+1). The features of the metal layer MJ, the via layer VJ, the metal layer M(J+1), and the via layer V(J+1) are replicated in the same order in the metal layer M(J+2), the via layer V(J+2), the metal layer M(J+3), and the via layer V(J+3) to double the conductive cross-section of the conductive structures $304_A$ and $304_B$. Thus, features of the metal layer M(J+2), the via layer V(J+2), the metal layer M(J+3), and the via layer V(J+3) are not separately described.

Figure 4:
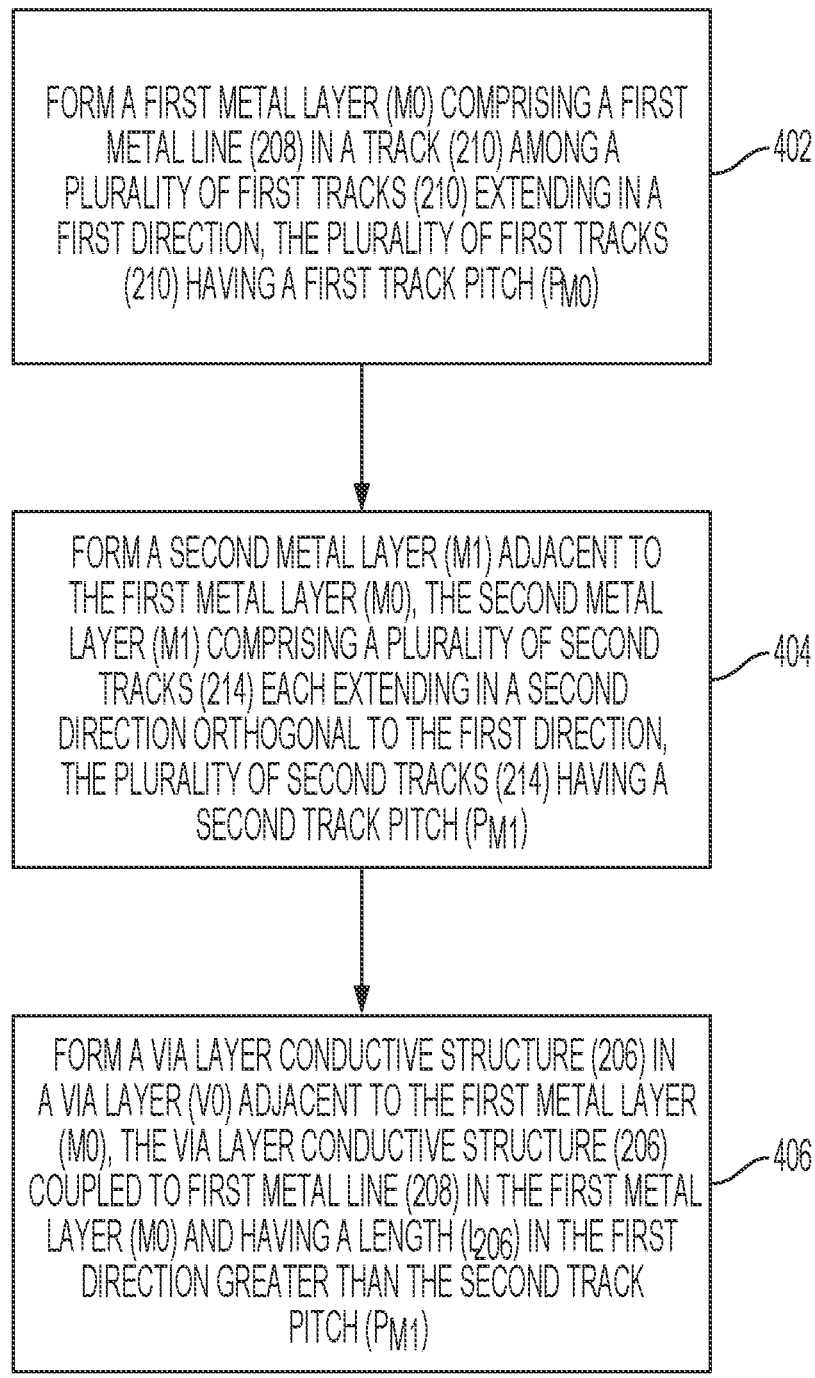
FIG. 4 is a flowchart of a method of fabricating an interconnect structure including a signal path including a via layer conductive structure extending in a direction parallel to signal flow.

FIG. 4 is a flow chart of a method 400 of fabricating the interconnect structure 200 in FIGS. 2A and 2C. The method includes forming a first metal layer M0 comprising a first metal line 208 in a track 210 among a plurality of first tracks 210 extending in a first direction (e.g., X-axis direction), the plurality of first tracks 210 having a first track pitch $P_{M0}$ (block 402). The method includes forming a second metal layer M1 adjacent to the first metal layer M0, the second metal layer M1 comprising a plurality of second tracks 214 each extending in a second direction (e.g., Y-axis direction) orthogonal to the first direction, the plurality of second tracks 214 having a second track pitch $P_{M1}$ (block 404). The method further includes forming a via layer conductive structure 206 in a via layer V0 adjacent to the first metal layer M0, the via layer conductive structure 206 coupled to first metal line 208 in the first metal layer M0 and having a length $L_{206}$ in the first direction greater than the second track pitch PM1 (block 406).

Figure 5:
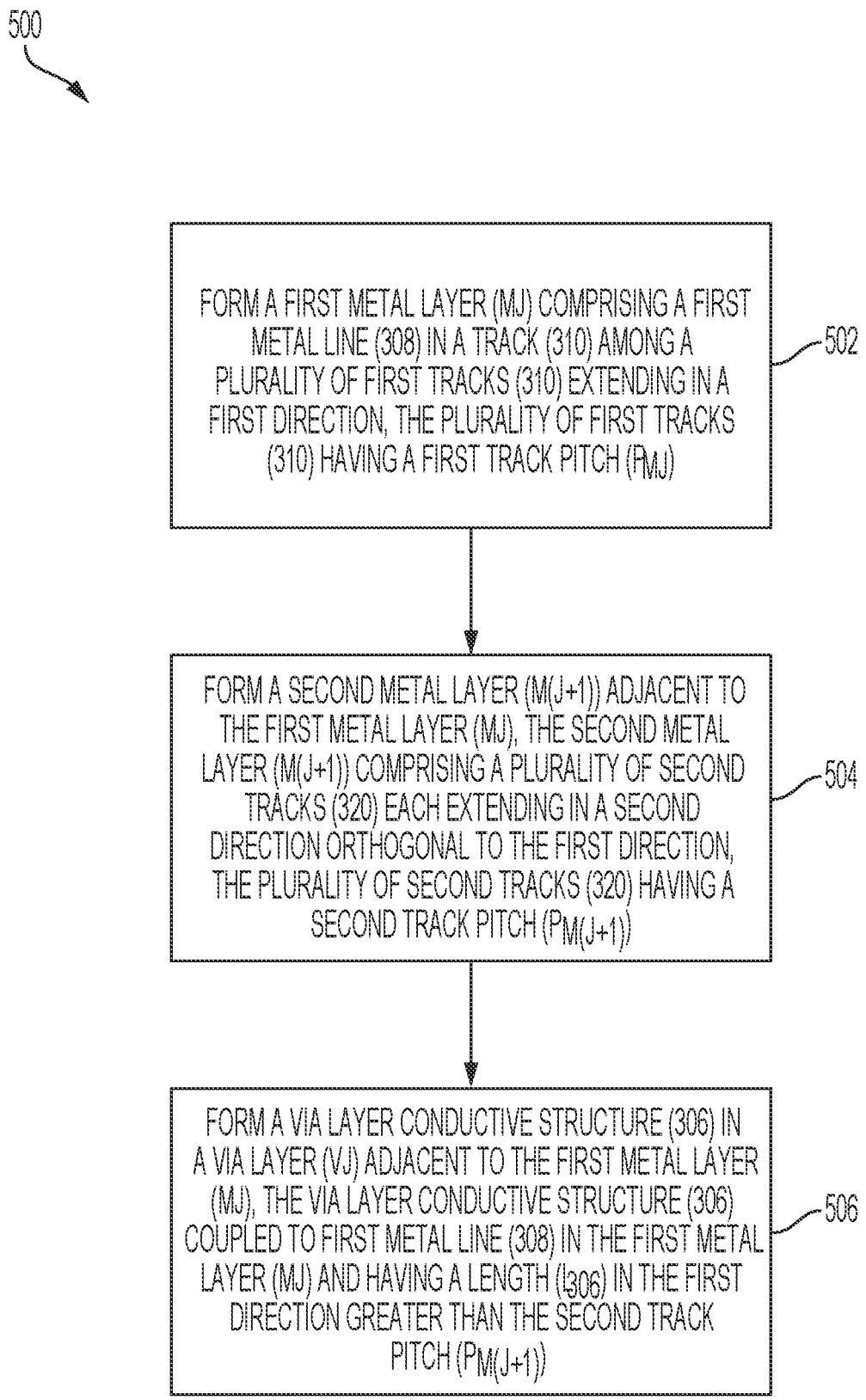
FIG. 5 is a flowchart of a method of fabricating an interconnect structure including a signal path including a via layer conductive structure extending in a direction orthogonal to signal flow.

FIG. 5 is a flow chart of a method 500 of fabricating the interconnect structure 300 in FIGS. 3A-3D. The method includes forming a first metal layer MJ comprising a first metal line 308 in a track 310 among a plurality of first tracks 310 extending in a first direction (e.g., Y-axis direction), the plurality of first tracks 310 having a first track pitch $P_{MJ}$ (block 502). The method includes forming a second metal layer M(J+1) adjacent to the first metal layer MJ, the second metal layer M(J+1) comprising a plurality of second tracks 320 each extending in a second direction (e.g., X-axis direction) orthogonal to the first direction, the plurality of second tracks 320 having a second track pitch $P_{M(J+3)}$ (block 504). The method further includes forming a via layer conductive structure 306 in a via layer VJ adjacent to the first metal layer MJ, the via layer conductive structure 306 coupled to the first metal line 308 in the first metal layer MJ and having a length $L_{306}$ in the first direction greater than the second track pitch $P_{M(J+1)}$ (block 506).

FIGS. 6A and 6B include a cross-sectional view in a fabrication stage 600A and a flowchart 600B of a method of fabricating an interconnect structure corresponding to the interconnect structures in FIGS. 2A-2C and 3A-3D. In the method in the flowchart 600B, a first metal layer 602 is formed on a first silicon carbon nitride (SiCN) layer 604 by a dual damascene process including depositing a layer of an IMD 606, patterning and etching metal tracks 608 in the IMD 606 extending in a first direction (e.g., Y-axis direction) and forming metal lines 610 of an interconnect metal IM in the metal tracks 608. The fabrication stage 600A optionally includes forming air gaps 612 between the metal lines 610, including etching the IMD 606 to form voids 614 between the metal lines 610, and depositing a silicon nitride layer 616 on sides 618 and bottom surfaces 620 of the air gaps 612. The fabrication stage 600A also includes depositing a second SiCN layer 624 on the first metal layer 602, which provides a diffusion barrier layer and seals air in the optional air gaps 612.

Figure 7A:
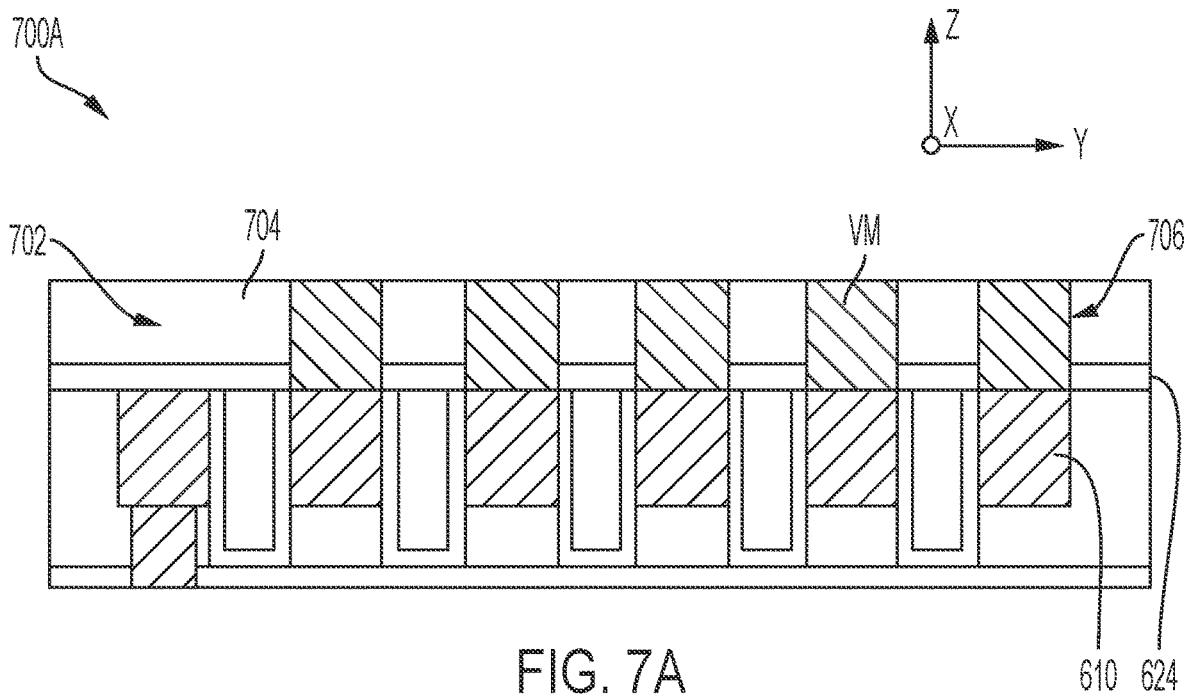
FIGS. 7A and 7B are a cross-sectional view and a flowchart of a method of in a fabrication stage for fabricating a via layer including a via layer conductive structure on the first metal layer fabricated in the first fabrication stage in FIGS. 6A and 6B.
Figure 7B:
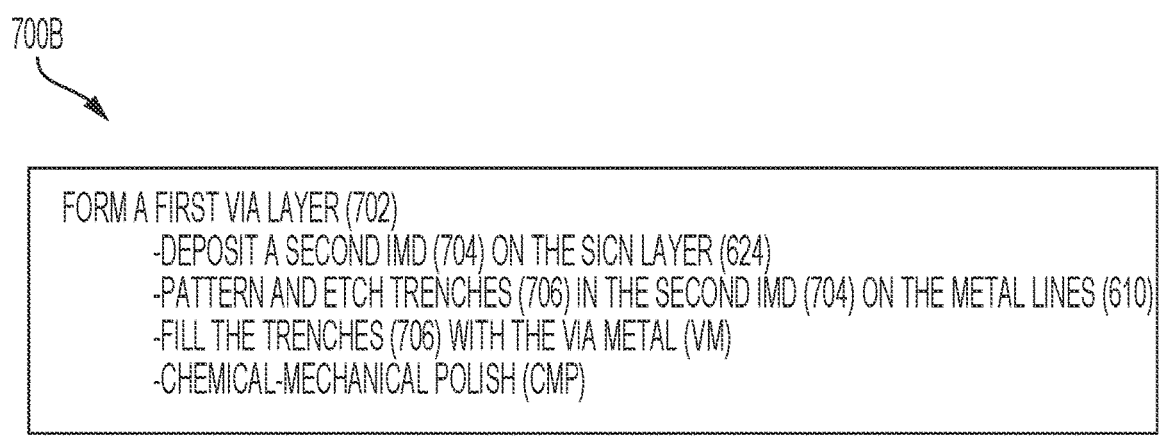

FIGS. 7A and 7B include a cross-sectional view in a fabrication stage 700A and a flowchart 700B of a method of fabricating a via layer 702 on the first metal layer 602 in FIG. 6A. The fabrication stage 700A includes depositing a second IMD 704 on the second SiCN layer 624 and forming the via layer 702 by a semi-damascene trench patterning process, including patterning and etching trenches 706 in the IMD 704 on the metal lines 610, and filling the trenches 706 with the via metal VM, which may be, for example, Ru, Mo, Co, W, and/or Cu. The fabrication stage 700A further includes chemical-mechanical polishing (CMP) of the via layer 702, to planarize the via metal VM and the IMD 704.

Figures 8A, 8B:
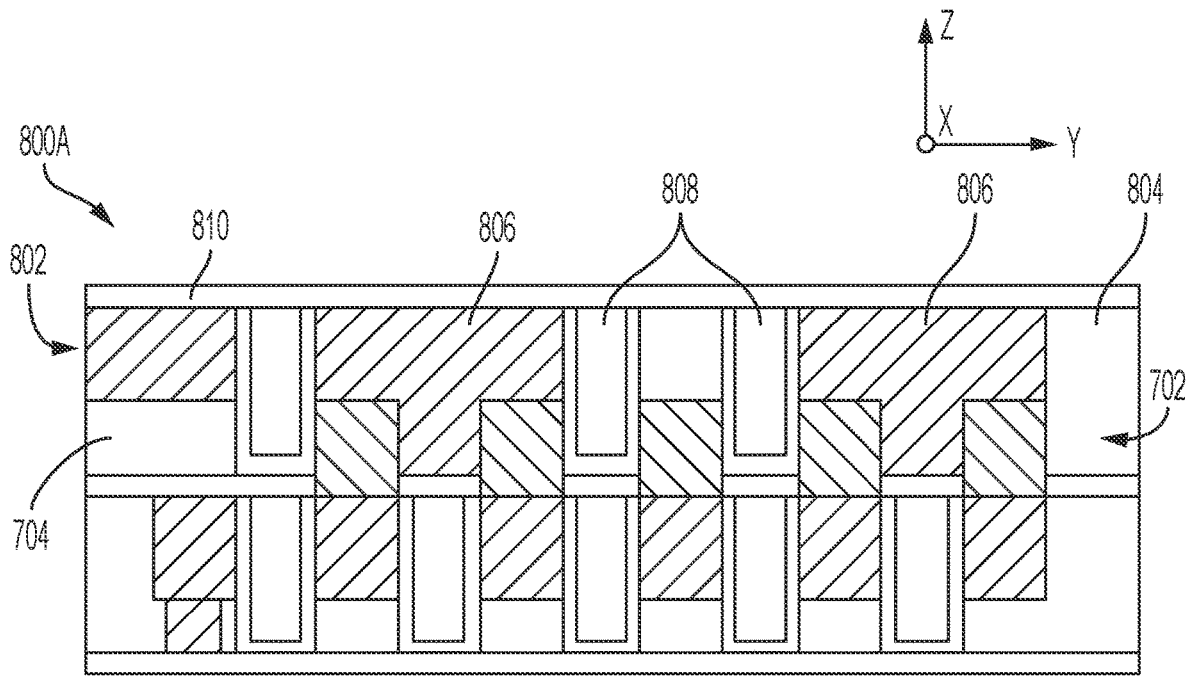
FIGS. 8A and 8B are a cross-sectional view and a flowchart of a method of in a fabrication stage for fabricating a second metal layer on the first via layer fabricated in the fabrication stage in FIGS. 7A and 7B.

FIGS. 8A and 8B include a cross-sectional view in a fabrication stage 800A and a flowchart 800B of a method of fabricating another metal layer 802 on the via layer 702. The fabrication stage 800A includes depositing a third IMD 804 layer. The fabrication stage 800A includes patterning and etching the third IMD 804 and portions of the second IMD 704 between the metal lines 610. The fabrication stage 800A further includes forming interconnect metal elements (e.g., metal lines) 806 in the etched second IMD 704 and third IMD 804 between and on the metal lines 610. The fabrication stage 800A optionally includes forming air gaps 808. The fabrication stage 800A also includes depositing a third SiCN layer 810.

Figures 9A, 9B:
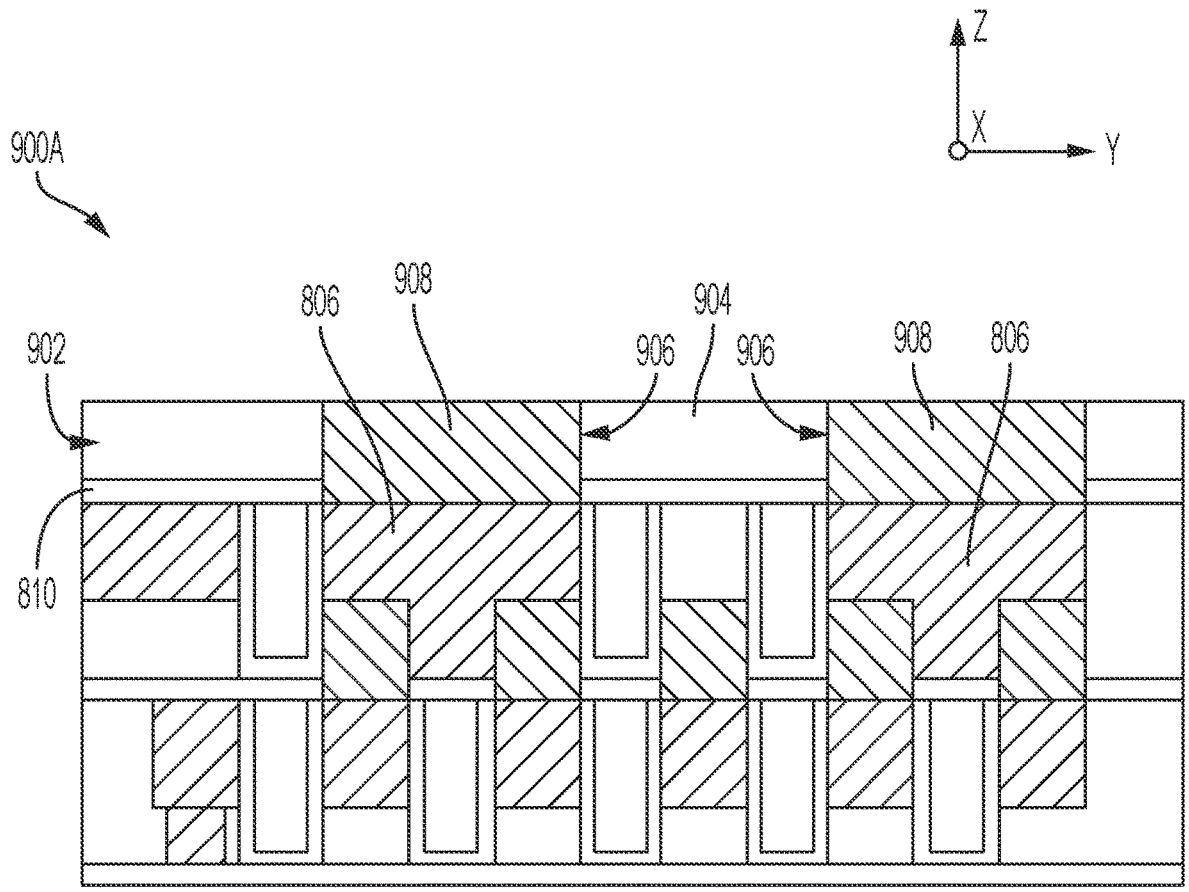
FIGS. 9A and 9B are a cross-sectional view and a flowchart of a method of in a fabrication stage for fabricating a second via layer including a via layer conductive structure on the second metal layer fabricated in the fabrication stage in FIGS. 8A and 8B.

FIGS. 9A and 9B include a cross-sectional view in a fabrication stage 900A and a flowchart 900B of a method of fabricating another via layer 902 on the metal layer 802 in FIG. 8A. The fabrication stage 900A includes a dual damascene process including forming a fourth IMD 904 on the third SiCN layer 810, patterning and etching the IMD 904 and the third SiCN layer 810 to form trenches 906 over the interconnect metal elements 806, and forming via metal elements 908 in the trenches 906.

Fabricating the interconnect structures 200 and 300 in FIGS. 2A-2C and 3A-3D includes fabricating additional alternating metal layers and via layers, wherein the directions that metal tracks extend in a metal layer is orthogonal to the directions of metal tracks in adjacent metal layers (e.g., above and below). For example, a next metal layer may be formed on the via layer 902, where the next metal layer would correspond to the metal layer 602 and would be formed according to the method in the flowchart in FIG. 6B. The methods in flowcharts 6B, 7B, 8B, and 9B performed in sequence may be employed to fabricate the interconnect structures 200 and 300 including the via layer conductive structures 206 and 306. The sequence may be repeated any number of times as needed to fabricate an interconnect structure including signal paths with a desired cross-sectional area and reduced resistance.

The 3D interconnect structures employing via layer conductive structures in via layers according to aspects disclosed herein may be provided in or integrated into any processor-based device.

Figure 10:
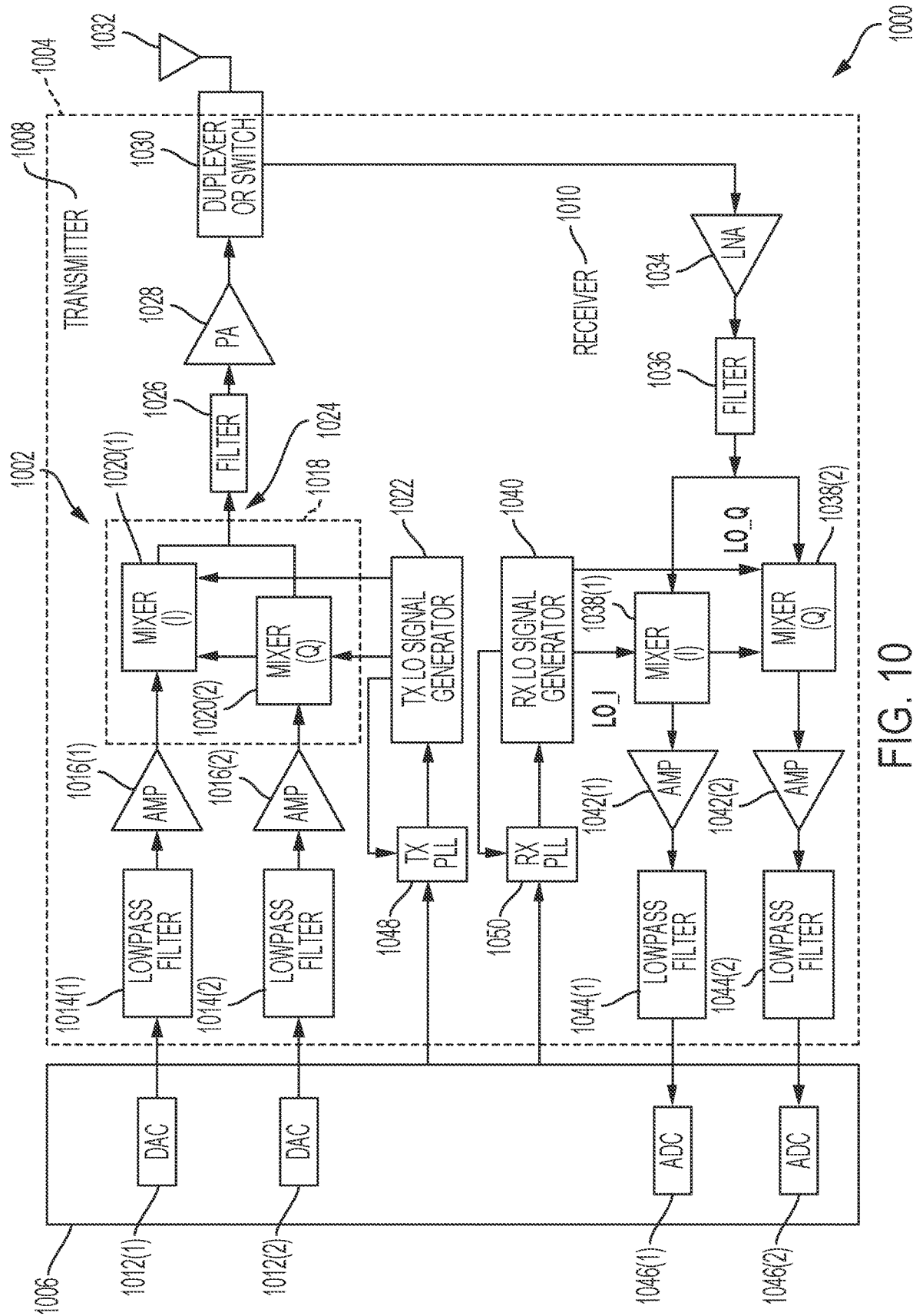
FIG. 10 is a block diagram of an exemplary wireless communications device that includes a radio frequency (RF) module including integrated circuits (ICs) including interconnect structures, as shown in FIGS. 2A-2C and 3A-3D.

FIG. 10 illustrates an exemplary wireless communications device 1000 that includes radio frequency (RF) components formed from one or more ICs 1002, wherein any of the ICs 1002 can include a system on chip (SoC) in an IC including an interconnect structure in which a via layer conductive structure is included in a via layer in a signal path to increase conductive cross-sectional area of the signal path to reduce resistance, which reduces IR drop and increases signal speed, as illustrated in FIGS. 2A-2C and 3A-3D, and according to any of the aspects disclosed herein. The wireless communications device 1000 may include or be provided in any of the above-referenced devices, as examples. As shown in FIG. 10, the wireless communications device 1000 includes a transceiver 1004 and a data processor 1006. The data processor 1006 may include a memory to store data and program codes. The transceiver 1004 includes a transmitter 1008 and a receiver 1010 that support bi-directional communications. In general, the wireless communications device 1000 may include any number of transmitters 1008 and/or receivers 1010 for any number of communication systems and frequency bands. All or a portion of the transceiver 1004 may be implemented on one or more analog ICs, RFICs, mixed-signal ICs, etc.

The transmitter 1008 or the receiver 1010 may be implemented with a super-heterodyne architecture or a direct-conversion architecture. In the super-heterodyne architecture, a signal is frequency-converted between RF and baseband in multiple stages, e.g., from RF to an intermediate frequency (IF) in one stage, and then from IF to baseband in another stage. In the direct-conversion architecture, a signal is frequency-converted between RF and baseband in one stage. The super-heterodyne and direct-conversion architectures may use different circuit blocks and/or have different requirements. In the wireless communications device 1000 in FIG. 10, the transmitter 1008 and the receiver 1010 are implemented with the direct-conversion architecture.

In the transmit path, the data processor 1006 processes data to be transmitted and provides I and Q analog output signals to the transmitter 1008. In the exemplary wireless communications device 1000, the data processor 1006 includes digital-to-analog converters (DACs) 1012(1), 1012(2) for converting digital signals generated by the data processor 1006 into the I and Q analog output signals, e.g., I and Q output currents, for further processing.

Within the transmitter 1008, lowpass filters 1014(1), 1014(2) filter the I and Q analog output signals, respectively, to remove undesired signals caused by the prior digital-to-analog conversion. Amplifiers (AMPs) 1016(1), 1016(2) amplify the signals from the lowpass filters 1014(1), 1014(2), respectively, and provide I and Q baseband signals. An upconverter 1018 upconverts the I and Q baseband signals with I and Q transmit (TX) local oscillator (LO) signals from a TX LO signal generator 1022 through mixers 1020(1), 1020(2) to provide an upconverted signal 1024. A filter 1026 filters the upconverted signal 1024 to remove undesired signals caused by the frequency upconversion as well as noise in a receive frequency band. A power amplifier (PA) 1028 amplifies the upconverted signal 1024 from the filter 1026 to obtain the desired output power level and provides a transmit RF signal. The transmit RF signal is routed through a duplexer or switch 1030 and transmitted via an antenna 1032.

In the receive path, the antenna 1032 receives signals transmitted by base stations and provides a received RF signal, which is routed through the duplexer or switch 1030 and provided to a low noise amplifier (LNA) 1034. The duplexer or switch 1030 is designed to operate with a specific receive (RX)-to-TX duplexer frequency separation, such that RX signals are isolated from TX signals. The received RF signal is amplified by the LNA 1034 and filtered by a filter 1036 to obtain a desired RF input signal. Down-conversion mixers 1038(1), 1038(2) mix the output of the filter 1036 with I and Q RX LO signals (i.e., LO_I and LO_Q) from an RX LO signal generator 1040 to generate I and Q baseband signals. The I and Q baseband signals are amplified by AMPs 1042(1), 1042(2) and further filtered by lowpass filters 1044(1), 1044(2) to obtain I and Q analog input signals, which are provided to the data processor 1006. In this example, the data processor 1006 includes analog-to-digital converters (ADCs) 1046(1), 1046(2) for converting the analog input signals into digital signals to be further processed by the data processor 1006.

In the wireless communications device 1000 of FIG. 10, the TX LO signal generator 1022 generates the I and Q TX LO signals used for frequency upconversion, while the RX LO signal generator 1040 generates the I and Q RX LO signals used for frequency downconversion. Each LO signal is a periodic signal with a particular fundamental frequency. A TX phase-locked loop (PLL) circuit 1048 receives timing information from the data processor 1006 and generates a control signal used to adjust the frequency and/or phase of the TX LO signals from the TX LO signal generator 1022. Similarly, an RX PLL circuit 1050 receives timing information from the data processor 1006 and generates a control signal used to adjust the frequency and/or phase of the RX LO signals from the RX LO signal generator 1040.

Wireless communications devices 1000 that each include a system on chip (SoC) in an IC including an interconnect structure in which a via layer conductive structure is included in a via layer in a signal path to increase conductive cross-sectional area of the signal path to reduce resistance, which reduces IR drop and increases signal speed, as illustrated in FIGS. 2A-3D, and according to any of the aspects disclosed herein, may be provided in or integrated into any processor-based device. Examples, without limitation, include a set top box, an entertainment unit, a navigation device, a communications device, a fixed location data unit, a mobile location data unit, a global positioning system (GPS) device, a mobile phone, a cellular phone, a smart phone, a session initiation protocol (SIP) phone, a tablet, a phablet, a server, a computer, a portable computer, a mobile computing device, a wearable computing device (e.g., a smart watch, a health or fitness tracker, eyewear, etc.), a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, a portable digital video player, an automobile, a vehicle component, avionics systems, a drone, and a multicopter.

Figure 11:
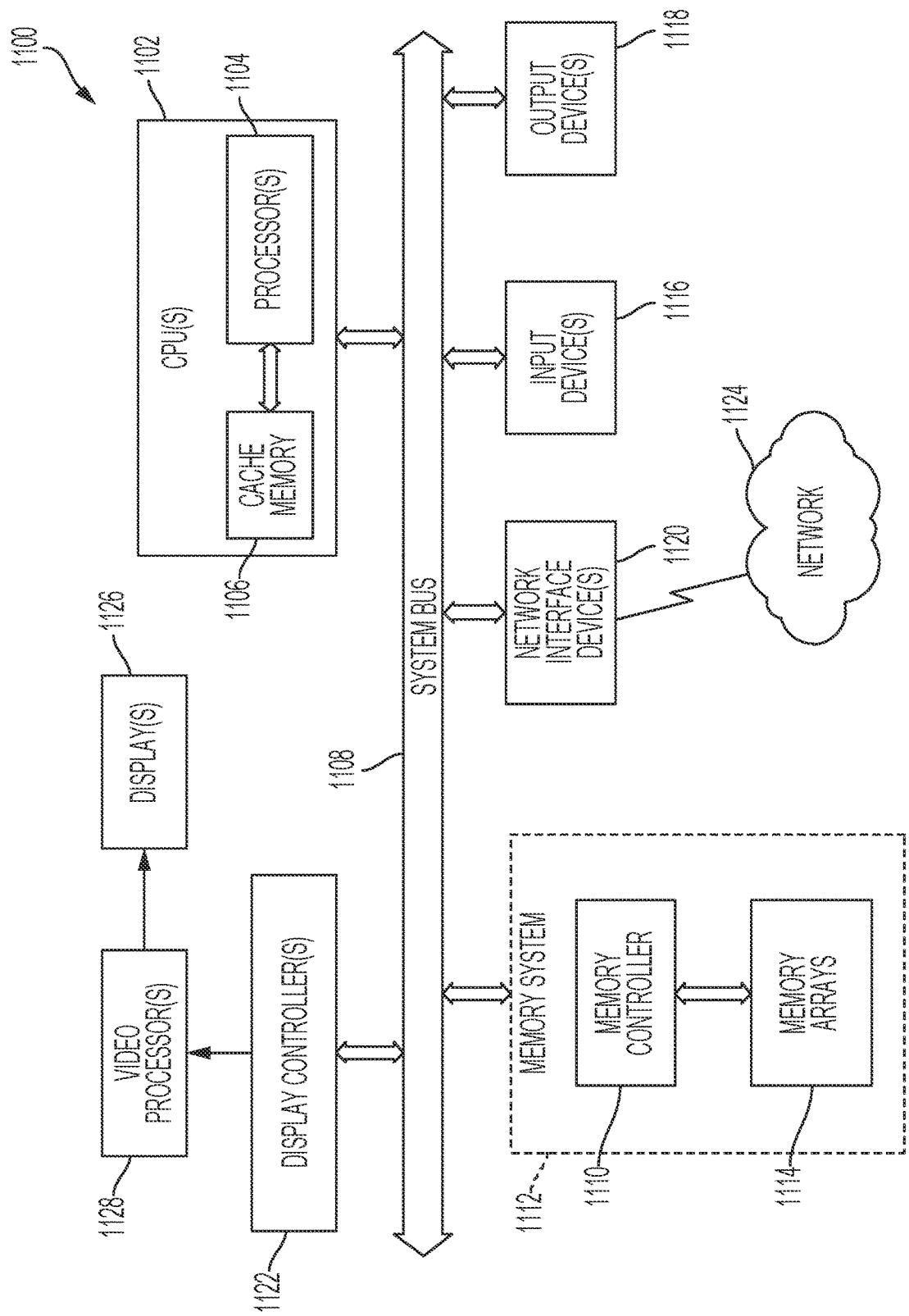
FIG. 11 is a block diagram of an exemplary processor-based system that can include ICs interconnect structures, as shown in FIGS. 2A-2C and 3A-3D, and according to any of the aspects disclosed herein.

In this regard, FIG. 11 illustrates an example of a processor-based system 1100 including ICs including an SoC in an IC including an interconnect structure in which a via layer conductive structure is included in a via layer in a signal path to increase conductive cross-sectional area of the signal path to reduce resistance, which reduces IR drop and increases signal speed, as illustrated in FIGS. 2A-2C and 3A-3D, and according to any aspects disclosed herein. In this example, the processor-based system 1100 includes one or more central processor units (CPUs) 1102, which may also be referred to as CPU or processor cores, each including one or more processors 1104. The CPU(s) 1102 may have cache memory 1106 coupled to the processor(s) 1104 for rapid access to temporarily stored data. As an example, the processor(s) 1104 could include an SoC in an IC including an interconnect structure in which a via layer conductive structure is included in a via layer in a signal path to increase conductive cross-sectional area of the signal path to reduce resistance, which reduces IR drop and increases signal speed, as illustrated in FIGS. 2A-3D, and according to any aspects disclosed herein. The CPU(s) 1102 is coupled to a system bus 1108 and can intercouple master and slave devices included in the processor-based system 1100. As is well known, the CPU(s) 1102 communicates with these other devices by exchanging address, control, and data information over the system bus 1108. For example, the CPU(s) 1102 can communicate bus transaction requests to a memory controller 1110 as an example of a slave device. Although not illustrated in FIG. 11, multiple system buses 1108 could be provided, wherein each system bus 108 constitutes a different fabric.

Other master and slave devices can be connected to the system bus 1108. As illustrated in FIG. 11, these devices can include a memory system 1112 that includes the memory controller 1110 and one or more memory arrays 1114, one or more input devices 1116, one or more output devices 1118, one or more network interface devices 1120, and one or more display controllers 1122, as examples. Each of the memory system 1112, the one or more input devices 1116, the one or more output devices 1118, the one or more network interface devices 1120, and the one or more display controllers 1122 can include a system on chip (SoC) in an IC including an interconnect structure in which a via layer conductive structure is included in a via layer in a signal path to increase conductive cross-sectional area of the signal path to reduce resistance, which reduces IR drop and increases signal speed, as illustrated in FIGS. 2A-3D, and according to any of the aspects disclosed herein. The input device(s) 1116 can include any type of input device, including, but not limited to, input keys, switches, voice processors, etc. The output device(s) 1118 can include any type of output device, including, but not limited to, audio, video, other visual indicators, etc. The network interface device(s) 1120 can be any device configured to allow exchange of data to and from a network 1124. The network 1124 can be any type of network, including, but not limited to, a wired or wireless network, a private or public network, a local area network (LAN), a wireless local area network (WLAN), a wide area network (WAN), a BLUETOOTH™ network, and the Internet. The network interface device(s) 1120 can be configured to support any type of communications protocol desired.

The CPU(s) 1102 may also be configured to access the display controller(s) 1122 over the system bus 1108 to control information sent to one or more displays 1126. The display controller(s) 1122 sends information to the display(s) 1126 to be displayed via one or more video processors 1128, which process the information to be displayed into a format suitable for the display(s) 1126. The display(s) 1126 can include any type of display, including, but not limited to, a cathode ray tube (CRT), a liquid crystal display (LCD), a plasma display, a light emitting diode (LED) display, etc. The display controller(s) 1122, display(s) 1126, and/or the video processor(s) 1128 can include a system on chip (SoC) in an IC including an interconnect structure in which a via layer conductive structure is included in a via layer in a signal path to increase conductive cross-sectional area of the signal path to reduce resistance, which reduces IR drop and increases signal speed, as illustrated in FIGS. 2A-3D, and according to any of the aspects disclosed herein.

Those of skill in the art will further appreciate that the various illustrative logical blocks, modules, circuits, and algorithms described in connection with the aspects disclosed herein may be implemented as electronic hardware, instructions stored in memory or in another computer readable medium and executed by a processor or other processing device, or combinations of both. The master and slave devices described herein may be employed in any circuit, hardware component, IC, or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

The aspects disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flowchart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations. Thus, the disclosure is not intended to be limited to the examples and designs described herein but is to be accorded the widest scope consistent with the principles and novel features disclosed herein.

Implementation examples are described in the following numbered clauses:

1. An interconnect structure, comprising:
   a first metal layer comprising a first metal line in a first track among a plurality of first tracks extending in a first direction, the plurality of first tracks having a first track pitch;
   a second metal layer adjacent to the first metal layer, the second metal layer comprising a plurality of second tracks extending in a second direction orthogonal to the first direction, the plurality of second tracks having a second track pitch; and
   a via layer conductive structure in a via layer adjacent to the first metal layer, the via layer conductive structure coupled to the first metal line in the first metal layer and having a first length in the first direction greater than the second track pitch.

2. The interconnect structure of clause 1, wherein the via layer conductive structure comprises a via metal element comprising a via metal disposed on a first surface of the first metal line.

3. The interconnect structure of clause 2, wherein the via layer conductive structure further comprises:
   a thickness of the via layer; and
   a width in the second direction corresponding to a first track width based on the first track pitch.

4. The interconnect structure of any of clauses 1-3, wherein:
   the first metal line has a second length in the first direction corresponding to a multiple of the second track pitch; and
   the first length of the via layer conductive structure corresponds to the multiple of the second track pitch.

5. The interconnect structure of any of clauses 1-4, wherein:
   the second metal layer further comprises:
      a first plurality of interconnect metal elements disposed in a consecutive plurality of second tracks among the plurality of second tracks, each of the first plurality of interconnect metal elements comprising an interconnect metal; and
   the via layer conductive structure further comprises:
      a first consecutive plurality of via metal elements comprising a via metal disposed on the first plurality of interconnect metal elements disposed in the consecutive plurality of second tracks; and
      a second plurality of interconnect metal elements each disposed between adjacent via metal elements among the first consecutive plurality of via metal elements.

6. The interconnect structure of clause 5, wherein each of the second plurality of interconnect metal elements is coupled to the adjacent via metal elements in the via layer conductive structure.

7. The interconnect structure of clause 6, wherein the first consecutive plurality of via metal elements and the second plurality of interconnect metal elements each comprise:
   a thickness of the via layer; and
   a width of the first track among the plurality of first tracks in the second direction based on the first track pitch.

8. The interconnect structure of any of clauses 5-7, wherein:
   the via layer conductive structure in the via layer comprises a first via layer conductive structure in a first via layer adjacent to a first side of the first metal layer; and
   the interconnect structure further comprises a second via layer conductive structure in a second via layer adjacent to a second side of the first metal layer, the second via layer conductive structure comprising the via metal disposed on a second surface of the first metal line and a third length in the first direction greater than the second track pitch.

9. The interconnect structure of clause 8, further comprising:
   a third metal layer adjacent to the second via layer, the third metal layer comprising:
      a plurality of third tracks extending in the second direction, the plurality of third tracks having a third track pitch; and
      the first plurality of interconnect metal elements disposed in a consecutive plurality of third tracks among the plurality of third tracks; and
   a third via layer on the third metal layer, the third via layer comprising a third via layer conductive structure, the third via layer conductive structure coupled to the first plurality of interconnect metal elements in the third metal layer and having a fourth length in the first direction greater than the second track pitch.

10. The interconnect structure of clause 9, the third via layer conductive structure comprising:
- a second consecutive plurality of via metal elements comprising the via metal disposed on the first plurality of interconnect metal elements in the third metal layer; and
- a third plurality of interconnect metal elements each disposed between and coupled to adjacent via metal elements among the second consecutive plurality of via metal elements.

11. The interconnect structure of clause 9 or clause 10, further comprising:
- a fourth metal layer adjacent to the third via layer, the fourth metal layer comprising:
  - a plurality of fourth tracks extending in the first direction and comprising a fourth track pitch; and
  - a fourth metal line comprising the interconnect metal disposed in a fourth track among the plurality of fourth tracks on the third via layer conductive structure; and
- a fourth via layer conductive structure in a fourth via layer on the fourth metal layer, the fourth via layer conductive structure comprising the via metal disposed on a surface of the fourth metal line and a fifth length in the first direction greater than the second track pitch.

12. The interconnect structure of any of clauses 1-11, the first metal layer further comprising:
- a second metal line in another first track among the plurality of first tracks extending in the first direction, the second metal line electrically isolated from the first metal line; and
- an air gap between the first metal line and the second metal line.

13. The interconnect structure of any of clauses 1-12 integrated into an integrated circuit (IC).

14. An interconnect structure, comprising:
- a first metal layer comprising:
  - a first metal line in a first track among a plurality of tracks extending in a first direction, the plurality of tracks having a track pitch; and
  - a second metal line in a second track among the plurality of tracks, the second track comprising an adjacent track next to the first track in a second direction orthogonal to the first direction; and
- a via layer conductive structure in a via layer adjacent to the first metal layer, the via layer conductive structure coupled to the first metal line and the second metal line and having a first length in the second direction greater than the track pitch.

15. The interconnect structure of clause 14, further comprising a second metal layer comprising an interconnect metal element disposed in a track extending in the second direction,
wherein:
- a first side of the via layer conductive structure in the via layer is disposed on the interconnect metal element; and
- a second side of the via layer conductive structure in the via layer is coupled to the first metal line and the second metal line.

16. The interconnect structure of clause 15, wherein:
the via layer conductive structure in the via layer comprises a first via layer conductive structure in a first via layer adjacent to a first side of the first metal layer, and the first via layer conductive structure comprises a via metal element comprising a via metal and a second length in the second direction greater than the track pitch; and
the interconnect structure further comprises:
- a second via layer conductive structure in a second via layer adjacent to a second side of the first metal layer, the second via layer conductive structure comprising:
  - a first via metal element disposed on the first metal line;
  - a second via metal element disposed on the second metal line; and
  - an interconnect metal element comprising an interconnect metal disposed between and coupled to the first and second via metal elements; and
- a third metal layer adjacent to the second via layer, the third metal layer comprising:
  - a third track on the second via layer conductive structure and extending in the first direction; and
  - a third metal line in the third track and coupled to the second via layer conductive structure.

17. A method of fabricating an interconnect structure, comprising:
- forming a first metal layer comprising a first metal line in a track among a plurality of first tracks extending in a first direction, the plurality of first tracks having a first track pitch;
- forming a second metal layer adjacent to the first metal layer, the second metal layer comprising a plurality of second tracks extending in a second direction orthogonal to the first direction, the plurality of second tracks having a second track pitch; and
- forming a via layer conductive structure in a via layer adjacent to the first metal layer, the via layer conductive structure coupled to the first metal line in the first metal layer and having a first length in the first direction greater than the second track pitch.

18. The method of clause 17, wherein:
forming the first metal layer comprising the first metal line comprises disposing an interconnect metal in the track among the plurality of first tracks; and
forming the via layer conductive structure further comprises disposing a via metal on the first metal line.

19. The method of clause 17 or clause 18, wherein:
forming the second metal layer further comprises forming a first plurality of interconnect metal elements comprising an interconnect metal in a plurality of consecutive second tracks among the plurality of second tracks; and
forming the via layer conductive structure further comprises:
- forming a plurality of consecutive via metal elements comprising a via metal disposed on the first plurality of interconnect metal elements; and
- forming a second plurality of interconnect metal elements each disposed between adjacent via metal elements among the plurality of consecutive via metal elements.

20. A method of fabricating an interconnect structure, the method comprising:
forming a first metal layer comprising:
- forming a first metal line in a first track among a plurality of tracks extending in a first direction, the plurality of tracks having a track pitch; and
- forming a second metal line in a second track among the plurality of tracks, the second track comprising an adjacent track next to the first track in a second direction orthogonal to the first direction; and forming a via layer conductive structure in a via layer adjacent to the first metal layer, the via layer conductive structure coupled to the first metal line and the second metal line and having a first length in the second direction greater than the track pitch.

21. The method of clause 20, further comprising:
forming a second metal layer comprising an interconnect metal element disposed in a track extending in the second direction; and forming the via layer conductive structure further comprises forming the via layer conductive structure on the interconnect metal element and coupled to the second metal layer and the first metal layer.

22. The method of clause 21, wherein:
forming the via layer conductive structure in the via layer further comprises forming a first via layer conductive structure in a first via layer on a first side of the first metal layer, the first via layer conductive structure comprising a first via layer element comprising a via metal and a second length in the second direction greater than the track pitch; and the method of fabricating the interconnect structure further comprises:
forming the first metal line in the first track and the second metal line in the second track comprising forming an interconnect metal in the first track and in the second track;

forming a second via layer conductive structure in a second via layer adjacent to a second side of the first metal layer, the second via layer conductive structure comprising:
a first via metal element disposed on the first metal line:
a second via metal element disposed on the second metal line; and
an interconnect metal element comprising the interconnect metal disposed between and coupled to the first and second via metal elements; and forming a third metal layer adjacent to the second via layer, the third metal layer comprising:
a third track on the second via layer conductive structure and extending in the first direction; and
a third metal line in the third track and coupled to the second via layer conductive structure.

What is claimed is:

1. An interconnect structure, comprising:
a first metal layer comprising a first metal line in a first track among a plurality of first tracks extending in a first direction, the plurality of first tracks having a first track pitch;
a second metal layer adjacent to the first metal layer, the second metal layer comprising a plurality of second tracks extending in a second direction orthogonal to the first direction, the plurality of second tracks having a second track pitch; and
a via layer conductive structure in a via layer adjacent to the first metal layer, the via layer conductive structure coupled to the first metal line in the first metal layer and having a first length in the first direction greater than the second track pitch,
wherein:
the second metal layer further comprises:
a first plurality of interconnect metal elements disposed in a consecutive plurality of second tracks among the plurality of second tracks, each of the first plurality of interconnect metal elements comprising an interconnect metal; and the via layer conductive structure further comprises:
a first consecutive plurality of via metal elements comprising a via metal disposed on the first plurality of interconnect metal elements disposed in the consecutive plurality of second tracks; and
a second plurality of interconnect metal elements each disposed between adjacent via metal elements among the first consecutive plurality of via metal elements.

2. The interconnect structure of claim 1, wherein the via layer conductive structure comprises a via metal element comprising a via metal disposed on a first surface of the first metal line.

3. The interconnect structure of claim 2, wherein the via layer conductive structure further comprises:
a thickness of the via layer; and
a width in the second direction corresponding to a first track width based on the first track pitch.

4. The interconnect structure of claim 1, wherein each of the second plurality of interconnect metal elements is coupled to the adjacent via metal elements in the via layer conductive structure.

5. The interconnect structure of claim 4, wherein the first consecutive plurality of via metal elements and the second plurality of interconnect metal elements each comprise:
a thickness of the via layer; and
a width of the first track among the plurality of first tracks in the second direction based on the first track pitch.

6. The interconnect structure of claim 1, wherein:
the via layer conductive structure in the via layer comprises a first via layer conductive structure in a first via layer adjacent to a first side of the first metal layer; and
the interconnect structure further comprises a second via layer conductive structure in a second via layer adjacent to a second side of the first metal layer, the second via layer conductive structure comprising the via metal disposed on a second surface of the first metal line and a third length in the first direction greater than the second track pitch.

7. The interconnect structure of claim 6, further comprising:
a third metal layer adjacent to the second via layer, the third metal layer comprising:
a plurality of third tracks extending in the second direction, the plurality of third tracks having a third track pitch; and
the first plurality of interconnect metal elements disposed in a consecutive plurality of third tracks among the plurality of third tracks; and
a third via layer on the third metal layer, the third via layer comprising a third via layer conductive structure, the third via layer conductive structure coupled to the first plurality of interconnect metal elements in the third metal layer and having a fourth length in the first direction greater than the second track pitch.

8. The interconnect structure of claim 7, the third via layer conductive structure comprising:
a second consecutive plurality of via metal elements comprising the via metal disposed on the first plurality of interconnect metal elements in the third metal layer; and
a third plurality of interconnect metal elements each disposed between and coupled to adjacent via metal elements among the second consecutive plurality of via metal elements.

9. The interconnect structure of claim 7, further comprising:
a fourth metal layer adjacent to the third via layer, the fourth metal layer comprising:
a plurality of fourth tracks extending in the first direction and comprising a fourth track pitch; and
a fourth metal line comprising the interconnect metal disposed in a fourth track among the plurality of fourth tracks on the third via layer conductive structure; and
a fourth via layer conductive structure in a fourth via layer on the fourth metal layer, the fourth via layer conductive structure comprising the via metal disposed on a surface of the fourth metal line and a fifth length in the first direction greater than the second track pitch.

10. The interconnect structure of claim 1, the first metal layer further comprising:
a second metal line in another first track among the plurality of first tracks extending in the first direction, the second metal line electrically isolated from the first metal line; and
an air gap between the first metal line and the second metal line.

11. The interconnect structure of claim 1 integrated into an integrated circuit (IC).

12. An interconnect structure, comprising:
a first metal layer comprising:
a first metal line in a first track among a plurality of tracks extending in a first direction, the plurality of tracks having a track pitch; and
a second metal line in a second track among the plurality of tracks, the second track comprising an adjacent track next to the first track in a second direction orthogonal to the first direction;
a via layer conductive structure in a via layer adjacent to the first metal layer, the via layer conductive structure coupled to the first metal line and the second metal line and having a first length in the second direction greater than the track pitch; and
a second metal layer comprising an interconnect metal element disposed in a track extending in the second direction,
wherein:
a first side of the via layer conductive structure in the via layer is disposed on the interconnect metal element; and
a second side of the via layer conductive structure in the via layer is coupled to the first metal line and the second metal line.

13. The interconnect structure of claim 12, wherein:
the via layer conductive structure in the via layer comprises a first via layer conductive structure in a first via layer adjacent to a first side of the first metal layer, and the first via layer conductive structure comprises a via metal element comprising a via metal and a second length in the second direction greater than the track pitch; and
the interconnect structure further comprises:
a second via layer conductive structure in a second via layer adjacent to a second side of the first metal layer, the second via layer conductive structure comprising:
a first via metal element disposed on the first metal line;
a second via metal element disposed on the second metal line; and
an interconnect metal element comprising an interconnect metal disposed between and coupled to the first and second via metal elements; and
a third metal layer adjacent to the second via layer, the third metal layer comprising:
a third track on the second via layer conductive structure and extending in the first direction; and
a third metal line in the third track and coupled to the second via layer conductive structure.

14. A method of fabricating an interconnect structure, comprising:
forming a first metal layer comprising a first metal line in a track among a plurality of first tracks extending in a first direction, the plurality of first tracks having a first track pitch;
forming a second metal layer adjacent to the first metal layer, the second metal layer comprising a plurality of second tracks extending in a second direction orthogonal to the first direction, the plurality of second tracks having a second track pitch; and
forming a via layer conductive structure in a via layer adjacent to the first metal layer, the via layer conductive structure coupled to the first metal line in the first metal layer and having a first length in the first direction greater than the second track pitch,
wherein:
forming the second metal layer further comprises forming a first plurality of interconnect metal elements comprising an interconnect metal in a plurality of consecutive second tracks among the plurality of second tracks; and
forming the via layer conductive structure further comprises:
forming a plurality of consecutive via metal elements comprising a via metal disposed on the first plurality of interconnect metal elements; and
forming a second plurality of interconnect metal elements each disposed between adjacent via metal elements among the plurality of consecutive via metal elements.

15. The method of claim 14, wherein:
forming the first metal layer comprising the first metal line comprises disposing an interconnect metal in the track among the plurality of first tracks; and
forming the via layer conductive structure further comprises disposing a via metal on the first metal line.

16. A method of fabricating an interconnect structure, the method comprising:
forming a first metal layer comprising:
forming a first metal line in a first track among a plurality of tracks extending in a first direction, the plurality of tracks having a track pitch; and
forming a second metal line in a second track among the plurality of tracks, the second track comprising an adjacent track next to the first track in a second direction orthogonal to the first direction;
forming a via layer conductive structure in a via layer adjacent to the first metal layer, the via layer conductive structure coupled to the first metal line and the second metal line and having a first length in the second direction greater than the track pitch; and
forming a second metal layer comprising an interconnect metal element disposed in a track extending in the second direction,
wherein forming the via layer conductive structure further comprises forming the via layer conductive structure on the interconnect metal element and coupled to the second metal layer and the first metal layer.

17. The method of claim 16, wherein: forming the via layer conductive structure in the via layer further comprises forming a first via layer conductive structure in a first via layer on a first side of the first metal layer, the first via layer conductive structure comprising a first via layer element comprising a via metal and a second length in the second direction greater than the track pitch; and the method of fabricating the interconnect structure further comprises: forming the first metal line in the first track and the second metal line in the second track comprising forming an interconnect metal in the first track and in the second track; forming a second via layer conductive structure in a second via layer adjacent to a second side of the first metal layer, the second via layer conductive structure comprising: a first via metal element disposed on the first metal line; a second via metal element disposed on the second metal line; and an interconnect metal element comprising the interconnect metal disposed between and coupled to the first and second via metal elements; and forming a third metal layer adjacent to the second via layer, the third metal layer comprising: a third track on the second via layer conductive structure and extending in the first direction; and a third metal line in the third track and coupled to the second via layer conductive structure.

18. An interconnect structure, comprising:
a first metal layer comprising a first metal line in a first track among a plurality of first tracks extending in a first direction, the plurality of first tracks having a first track pitch;
a second metal layer adjacent to the first metal layer, the second metal layer comprising a plurality of second tracks extending in a second direction orthogonal to the first direction, the plurality of second tracks having a second track pitch; and
a via layer conductive structure in a via layer adjacent to the first metal layer, the via layer conductive structure coupled to the first metal line in the first metal layer and having a first length in the first direction greater than the second track pitch,
wherein:
the first metal line has a second length in the first direction corresponding to a multiple of the second track pitch; and
the first length of the via layer conductive structure corresponds to the multiple of the second track pitch.

* * * * *